US00RE49506E

(19) United States
(12) Reissued Patent
Cho et al.

(10) Patent Number: US RE49,506 E
(45) Date of Reissued Patent: *Apr. 25, 2023

(54) HIGH/LOW SPEED MODE SELECTION FOR OUTPUT DRIVER CIRCUITS OF A MEMORY INTERFACE

(71) Applicant: Samsung Electronics Co., Ltd., Suwon-si (KR)

(72) Inventors: Young Chul Cho, Seongnam-si (KR); Jung Bae Lee, Seongnam-si (KR); Jung Hwan Choi, Hwaseong-si (KR)

(73) Assignee: Samsung Electronics Co., Ltd., Gyeonggi-do (KR)

( * ) Notice: This patent is subject to a terminal disclaimer.

(21) Appl. No.: 16/838,536

(22) Filed: Apr. 2, 2020

Related U.S. Patent Documents

Reissue of:
(64) Patent No.: 9,934,169
Issued: Apr. 3, 2018
Appl. No.: 15/416,565
Filed: Jan. 26, 2017

U.S. Applications:
(63) Continuation of application No. 14/818,586, filed on Aug. 5, 2015, now Pat. No. 9,575,923, which is a (Continued)

(30) Foreign Application Priority Data

Mar. 15, 2013 (KR) ..... 10-2013-0028039

(51) Int. Cl.
*G06F 13/16* (2006.01)
*G06F 13/40* (2006.01)
(Continued)

(52) U.S. Cl.
CPC ..... *G06F 13/16* (2013.01); *G05F 1/625* (2013.01); *G06F 1/3287* (2013.01);
(Continued)

(58) Field of Classification Search
CPC ... G11C 7/1051; G11C 7/1057; G11C 7/1048; G06F 1/3287; G06F 13/4068;
(Continued)

(56) References Cited

U.S. PATENT DOCUMENTS 5,705,937 A * 1/1998 Yap ..... H03H 11/28 326/30
5,751,978 A * 5/1998 Tipple ..... H03K 19/018585 326/82
(Continued)

FOREIGN PATENT DOCUMENTS

JP 2813103 B2 10/1998
JP 4061489 B2 3/2008
(Continued)

OTHER PUBLICATIONS

U.S. Office Action dated May 6, 2022 issued in co-pending U.S. Appl. No. 16/839,573.

*Primary Examiner* — B. James Peikari
(74) *Attorney, Agent, or Firm* — Harness, Dickey & Pierce, P.L.C.

(57) ABSTRACT

A method of operating an input/output interface includes selecting one of a plurality of output driver circuits according to a mode selection signal, and outputting a data signal using the selected one of the plurality of output driver circuits. Another method of operating an includes generating a mode selection signal based on a received command signal, and controlling an on-die termination (ODT) circuit included in the input/output interface according to the mode selection signal. Another method of operating an includes generating a mode selection signal based on a received command signal, and controlling an ODT circuit included in the input/output interface according to the mode selection signal.

21 Claims, 28 Drawing Sheets

Related U.S. Application Data continuation of application No. 14/093,916, filed on Dec. 2, 2013, now Pat. No. 9,130,557.

(60) Provisional application No. 61/732,589, filed on Dec. 3, 2012.

(51) Int. Cl.

| | |
|---|---|
| ***G06F 1/32*** | (2019.01) |
| ***G05F 1/625*** | (2006.01) |
| ***G06F 1/3287*** | (2019.01) |
| ***G06F 13/42*** | (2006.01) |
| ***H03K 19/00*** | (2006.01) |

(52) U.S. Cl.
CPC ..... *G06F 13/4068* (2013.01); *G06F 13/4221* (2013.01); *H03K 19/0005* (2013.01); *Y02D 10/00* (2018.01)

(58) Field of Classification Search
CPC . G06F 13/16; G06F 13/4221; H03K 19/0005; G05F 1/625; Y02D 10/00
See application file for complete search history.

(56) References Cited

U.S. PATENT DOCUMENTS 5,949,252 A 9/1999 Taguchi
6,208,168 B1 * 3/2001 Rhee ..... G11C 7/1051 326/83
6,542,946 B1 4/2003 Wooten
6,642,740 B2 11/2003 Kim et al.
7,034,565 B2 * 4/2006 Lee ..... G11C 7/1057 326/26
7,372,294 B2 * 5/2008 Kim ..... G11C 29/50008 326/16
7,408,378 B2 * 8/2008 Best ..... H04L 25/0278 326/30
7,612,579 B2 11/2009 Fujisawa
7,626,417 B2 * 12/2009 Oh ..... H04L 25/0292 326/32
7,671,622 B2 * 3/2010 Oh ..... H03K 19/0005 326/32
7,741,867 B2 6/2010 Carr et al.
8,008,944 B2 8/2011 Dixit et al.
8,035,413 B2 10/2011 Millar
8,242,796 B2 8/2012 de la Puente et al.
2006/0044008 A1 * 3/2006 Miyake ..... H04L 25/0298 326/30
2006/0158214 A1 7/2006 Janzen et al.
2006/0255830 A1 11/2006 Kim
2007/0070717 A1 * 3/2007 Kim ..... G11C 29/02 365/189.07
2007/0126466 A1 * 6/2007 Kim ..... G11C 29/50008 326/30
2007/0222476 A1 9/2007 Lee
2008/0030221 A1 2/2008 Lee et al.
2008/0054936 A1 3/2008 Fujisawa
2008/0164904 A1 * 7/2008 Kim ..... G11C 7/1051 326/30
2008/0284465 A1 * 11/2008 Kao ..... H04L 25/0278 326/30
2009/0237109 A1 * 9/2009 Haig ..... H03K 19/0005 326/30
2010/0097094 A1 4/2010 Jang
2010/0208534 A1 8/2010 Fujisawa
2010/0259294 A1 10/2010 Choo et al.
2010/0302893 A1 12/2010 Sato et al.
2011/0280322 A1 11/2011 Suenaga et al.
2012/0146687 A1 * 6/2012 Kim ..... H03K 19/0005 326/30
2012/0254663 A1 10/2012 Nakano et al.
2013/0069689 A1 3/2013 Song et al.
2014/0028345 A1 1/2014 Oh et al.

FOREIGN PATENT DOCUMENTS

KR 2003-0090955 A 12/2003
KR 20070036473 A * 4/2007 ..... G11C 29/022
KR 2009-0108800 A 10/2009
KR 10-1161740 B1 7/2012

* cited by examiner

FIG. 3
AMENDED
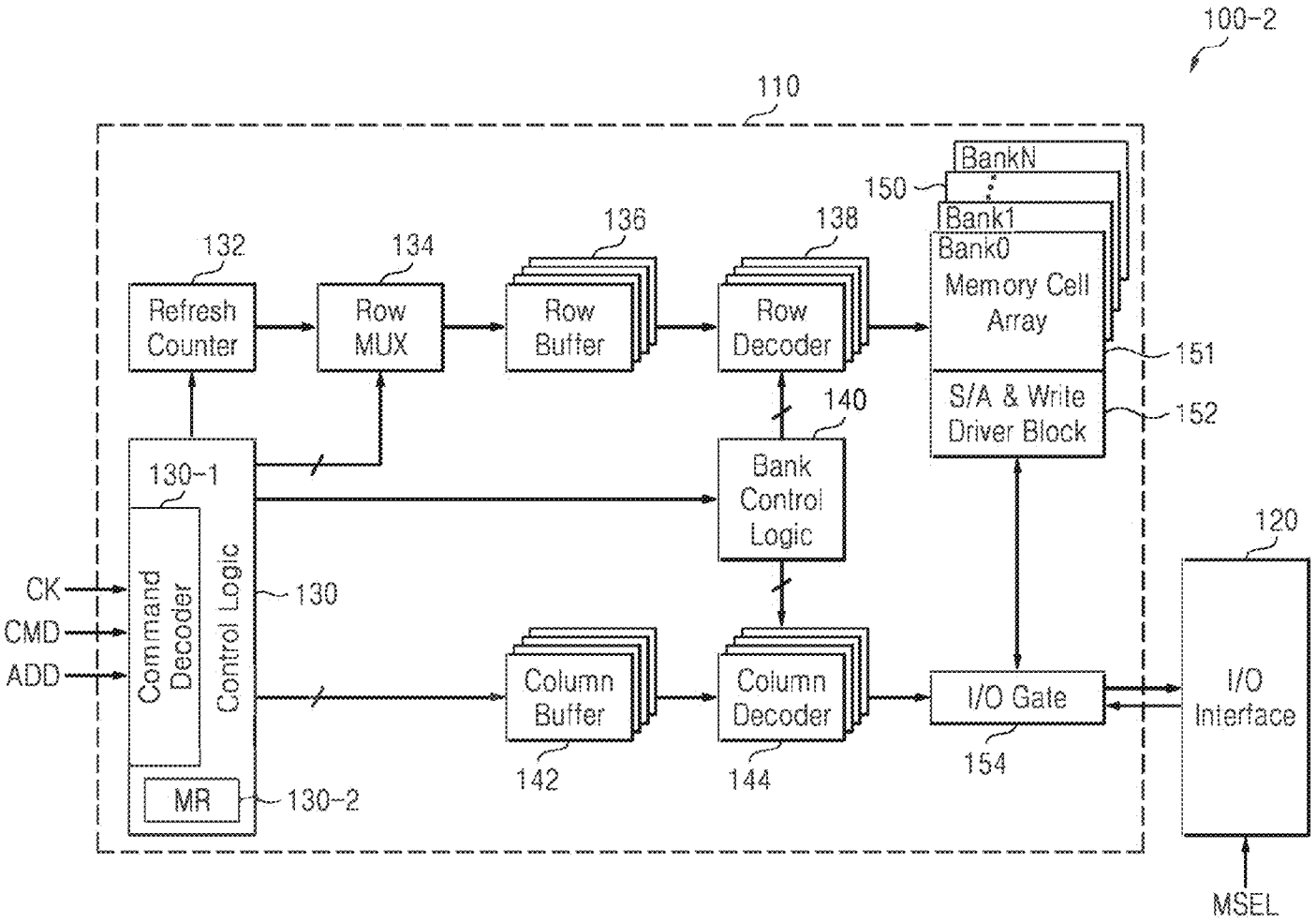

FIG. 24
AMENDED
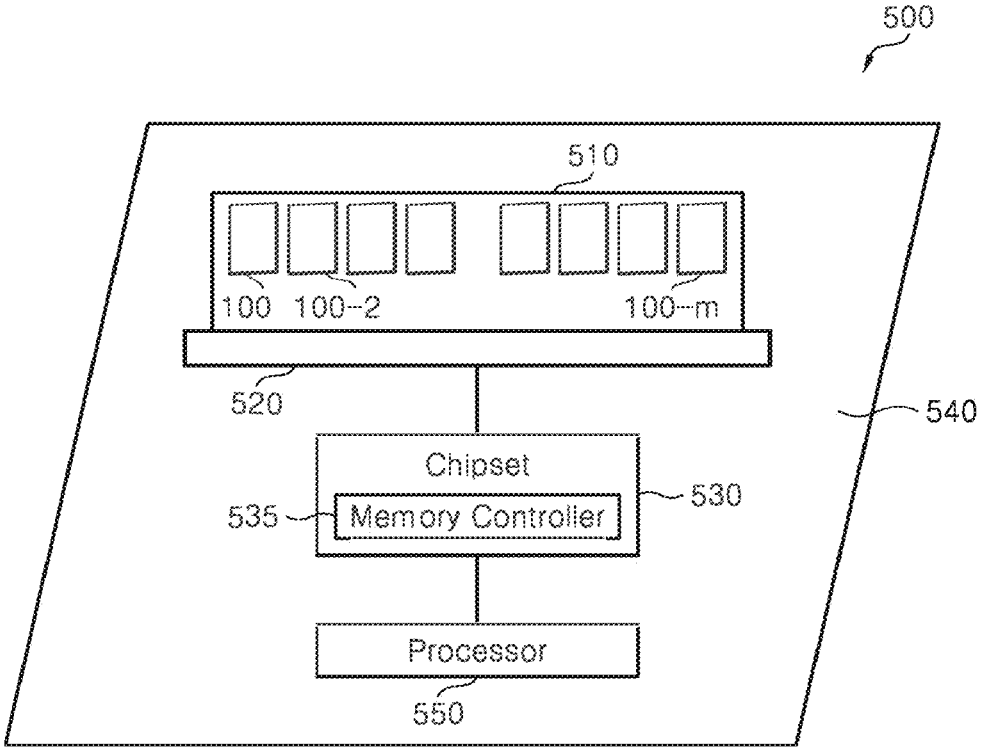

FIG. 28
AMENDED
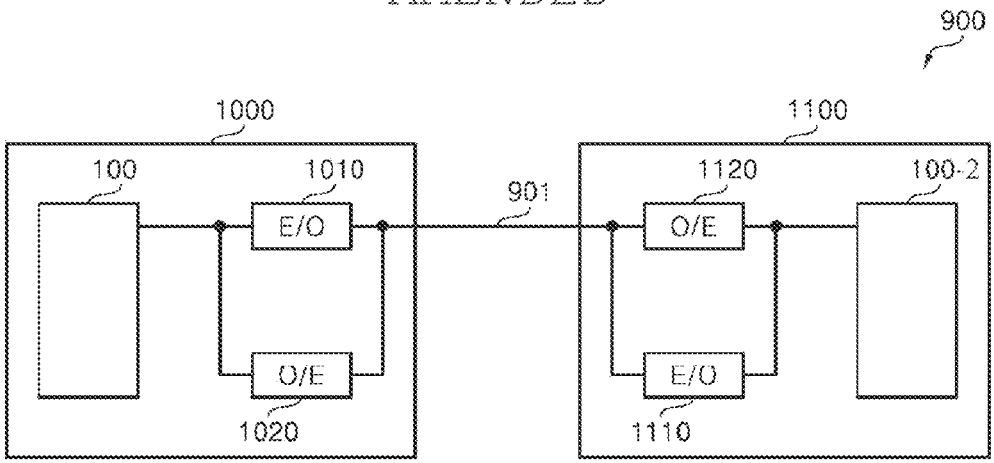

HIGH/LOW SPEED MODE SELECTION FOR OUTPUT DRIVER CIRCUITS OF A MEMORY INTERFACE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*Notice: more than one reissue application has been filed for the reissue of U.S. Pat. No. 9,934,169. The reissue applications are application Ser. Nos. 16/839,573 and 16/838,536 (the present application), both of which are reissues of U.S. Pat. No. 9,934,169.* This application is *a reissue application for U.S. Pat. No. 9,934,169 issued on Apr. 3, 2018 on U.S. Ser. No. 15/416,565 filed Jan. 26, 2017, which was* a continuation of U.S. application Ser. No. 14/818,586, filed on Aug. 5, 2015, which was a continuation of U.S. application Ser. No. 14/093,916 filed Dec. 2, 2013 which claims priority under 35 U.S.C. § 119(e) to U.S. provisional patent application No. 61/732,589 filed on Dec. 3, 2012, and under 35 U.S.C. § 119(a) to Korean Patent Application No. 10-2013-0028039 filed on Mar. 15, 2013, the entire contents of each of which are hereby incorporated by reference in their entirety, *and is co-pending with application Ser. No. 16/839,573, filed on Apr. 3, 2020, which is another reissue application of U.S. Pat. No. 9,934,169.*

BACKGROUND

Embodiments of the present inventive concepts relate to a method of operating input/output interfaces, and more particularly to a method of operating an input/output interface which may select and use one of a plurality of output driver circuits or one of a plurality of input receiver circuits.

Each of a system on chip (SoC) including a central processing unit (CPU) and a memory controller and a memory device (e.g., main memory), connected to the SoC includes an input/output interface for interfacing mutual data transmission.

According to an increased operation speed, as a swing width of a data signal mutually transmitted and received between the SoC and the memory device gets decreased, not only an influence of external noise gets increased, but also impedance mismatching in the input/output interface may be a problem. In order to solve the impedance mismatching, the input/output interface may include an impedance mismatching circuit which is referred to as On-Die Termination, On-Chip Termination, or On-Board Termination.

SUMMARY

According to an example embodiment of the inventive concepts, a method of operating an input/output interface is provided. The method may include selecting one of a plurality of output driver circuits according to a mode selection signal, and outputting a data signal using the selected output driver circuit. The mode selection signal is a control signal for controlling an on-die termination (ODT) circuit included in the input/output interface.

Example embodiments provide that the method may further include generating the mode selection signal according to a memory latency before the selecting.

Example embodiments provide that the memory latency may be a read latency or a write latency.

Example embodiments provide that the method may further include generating the mode selection signal based on a mode register set (MRS) command before the selecting. The MRS command may be used for adjusting an operation frequency.

Example embodiments provide that the selecting may select one of the plurality of output driver circuits which includes a NMOS pull-up transistor when the mode selection signal indicates an operation mode for a high speed operation, and one of the plurality of output driver circuits which includes a PMOS pull-up transistor when the mode selection signal indicates an operation mode for a low speed operation.

Example embodiments provide that the method may further include selecting one of a plurality of termination levels of the ODT circuit included in the input/output interface according to the mode selection signal.

Example embodiments provide that the plurality of termination levels may include a supply voltage level, a ground voltage level, and a medium level between the supply voltage level and the ground voltage level.

According to an example embodiment of the inventive concepts, a method of operating an input/output interface is provided. The method may include selecting one of a plurality of input receiver circuits according to a mode selection signal, and receiving a data signal input using the selected input receiver circuit.

Example embodiments provide that the mode selection signal may be a control signal for controlling the on-die termination (ODT) circuit included in the input/output interface.

Example embodiments provide that the method may further include generating the mode selection signal according to memory latency before the selecting, and the memory latency may include a read latency and write latency.

Example embodiments provide that the method may further include generating the mode selection signal based on a mode register set (MRS) command, the MRS command may be used for adjusting a memory operation frequency before the selecting.

Example embodiments provide that the selecting may select a different input receiver circuit when the mode selection signal indicates an operation mode for a high speed operation and than when the mode selection signal indicates an operation mode for a low speed operation.

Example embodiments provide that the selecting may select at least one of the plurality of input receiver circuits having a plurality of stages when the mode selection signal indicates an operation mode for a high speed operation.

Example embodiments provide that the selecting may select at least one of the plurality of input receiver circuits having different types of MOS transistors when the mode selection signal indicates an operation mode for a low speed operation, the different types of MOS transistors being connected to each other in series.

Example embodiments provide that the method may further include selecting one of a plurality of sense amplifier flip-flops according to the mode selection signal.

According to an example embodiment, a method of operating an input/output interface is provided. The method may include generating a mode selection signal based on a received command signal, and controlling an on-die termination (ODT) circuit included in the input/output interface according to the mode selection signal.

Example embodiments provide that a controller of a memory device includes a mode register configured to store operation mode data for controlling the memory device, and the operation mode data includes memory latency data and operation frequency data. The memory latency data may indicate a memory latency of the memory device. The operation frequency data may indicate an operation frequency of the memory device.

Example embodiments provide that generating the mode selection signal is further based on the operation frequency data.

Example embodiments provide that generating the mode selection signal is further based on the memory latency data.

Example embodiment provide that the method may further include selecting one of a plurality of output driver circuits according to the mode selection signal, and outputting a data signal using the selected one of the plurality of output driver circuits.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 3 is a block diagram according to an example embodiment of the memory device illustrated in FIG. 1;

FIG. 24 is a block diagram according to an example embodiment of the memory system including the memory device illustrated in FIG. 1;

FIG. 28 is a block diagram according to still another example embodiment of the memory system including the memory device illustrated in FIG. 1.

DETAILED DESCRIPTION OF THE EMBODIMENTS

Figure 1:
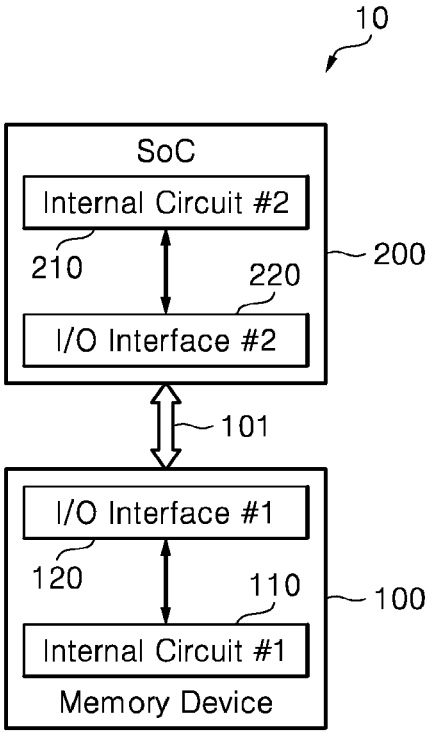
FIG. 1 is a block diagram of a memory system according to an example embodiment of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory system according to an example embodiment of the inventive concepts. Referring to FIG. 1, a memory system 10 according to an example embodiment of the inventive concepts may include a memory device 100 (e.g., a main memory) and a system on chip (SoC) 200.

According to an example embodiment, the memory system 10 may be embodied in a mobile application processor (AP); however, a technical scope of the inventive concepts is not limited thereto. In various embodiments, the memory system 10 may be embodied in a special purpose AP and/or any other like AP.

The memory device 100 may include a first internal circuit 110 composing the inside of the memory device 100 and a first input/output (I/O) interface 120. According to an example embodiment, the memory device 100 may be embodied in a dynamic random access memory (DRAM) (e.g., synchronous DRAM (SDRAM) and the like), and a technical scope of the inventive concepts is not limited thereto.

The first input/output interface 120 may interface a data signal input or a data signal output between the first internal circuit 110 and the SoC 200. The first internal circuit 110 and the first input/output interface 120 are described in detail referring to FIGS. 2 to 19.

The memory device 100 may be connected to the SoC 200 through a bus 101. The SoC 200 may include a second internal circuit 210 composing the inside of the SoC 200 and a second input/output interface 220.

According to an example embodiment, the second internal circuit 210 may include a central processing unit (CPU) (not shown) for entirely performing an operation of the memory system 10, a graphic processing unit (GPU) (not shown), and/or a memory controller (not shown). According to an example embodiment, the second input/output interface 220 may be included in the memory controller. A structure of the second internal circuit 210 is substantially the same as a structure of the first internal circuit 110.

Figure 2:
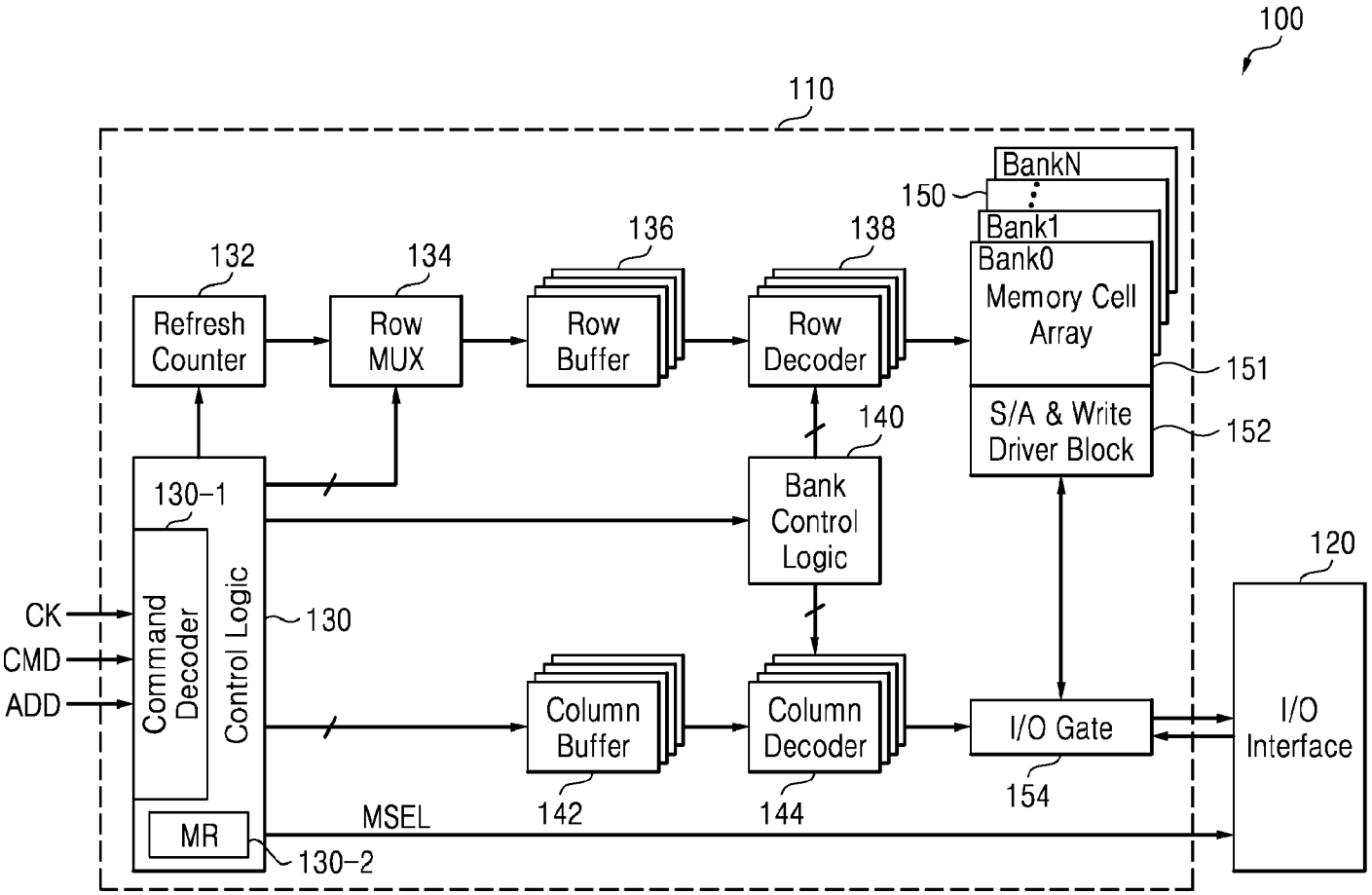
FIG. 2 is a block diagram according to an example embodiment of a memory device illustrated in FIG. 1.

FIG. 2 is a block diagram according to an example embodiment of a memory device illustrated in FIG. 1. Referring to FIGS. 1 and 2, the first internal circuit 110 of the memory device 100 may include a control logic 130, a refresh counter 132, a row multiplexer 134, a plurality of row buffers 136, a plurality of row decoders 138, a bank control logic 140, a plurality of column buffers 142, a plurality of column decoders 144, a plurality of banks 150, and an input/output gate 154.

The control logic 130 may control each configuration element (e.g., the refresh counter 132, the row multiplexer 134, the bank control logic 140, and/or a plurality of column buffers 142) in response to a plurality of signals (a clock signal CK, a command signal CMD, and an address signal ADD).

The command signal CMD may denote a combination of a plurality of commands (e.g., CS, RAS, CAS, and/or WE). According to an example embodiment, the command signal CMD and the address signal ADD may be transmitted from a memory controller (not shown) included in the SoC 200.

The control logic 130 may include a command decoder 130-1 and a mode register 130-2. According to an example embodiment, the command decoder 130-1 and/or the mode register 130-2 may be separately embodied outside the control logic 130. The command decoder 130-1 may decode a command signal CMD configured to have a plurality of signals (e.g., CS, RAS, CAS, and/or WE) based on a clock signal CK, and generate a command for controlling each configuration element (e.g., the refresh counter 132, the row multiplexer 134, the bank control logic 140, and/or the plurality of column buffers 142) according to a result of the decoding.

According to an example embodiment, the command decoder 130-1 may decode the command signal CMD, and generate a command for performing various types of operations (e.g., a read operation, a write operation, and/or a refresh operation).

The mode register 130-2 stores data for controlling various operation modes of the memory device 100. According to an example embodiment, the mode register 130-2 may store data about a memory latency of the memory device 100, data about an operation frequency, and/or data necessary for a control of the on-die termination (ODT) circuit (not shown).

The refresh counter 132, in response to a refresh command output from the command decoder 130-1, may generate a row address corresponding to the refresh command.

The row multiplexer 134 may select one of a row address generated by the refresh counter 132 and a row address output from the control logic 130 in response to a selection signal (not shown). According to an example embodiment, when a refresh operation is performed, the row multiplexer 134 may select a row address generated by the refresh counter 132. According to another example embodiment, when a normal memory access operation (e.g., a read operation or a write operation), is performed, the row multiplexer 134 may select a row address output from the control logic 130.

Each of the plurality of row decoders 136 may buffer a row address output from the row multiplexer 134. According to an example embodiment, the plurality of row decoders 138 may be embodied in a row decoder; however, example embodiments are not limited thereto.

A row decoder corresponding to a bank selected by the bank control logic 140 among the plurality of row decoders 138 may decode a row address output from a row buffer corresponding to the bank among the plurality of row buffers 136. According to an example embodiment, the plurality of row decoders 138 may be embodied in a row decoder; however, example embodiments are not limited thereto.

The bank control logic 140 may select at least one of the plurality of banks 150 according to a control signal and/or command of the control logic 130.

Each of the plurality of column buffers 142 may buffer a column address output from the control logic 130. According to an example embodiment, the plurality of column buffers 142 may be embodied in one column buffer; however, example embodiments are not limited thereto. A column decoder corresponding to a bank selected by the bank control logic 140 among the plurality of column decoders 144 may decode a column address output from a column buffer corresponding to the bank among the plurality of column buffers 142.

According to an example embodiment, the plurality of column decoders 144 may be embodied in one column decoder; however, example embodiments are not limited thereto.

Each of the plurality of banks 150 each labeled as Bank0 to BankN may include a memory cell array 151 and a sense amplifiers & write driver block 152.

For convenience of description, it is illustrated that each of the plurality of banks 150 is embodied in different layers; however, the scope of the inventive concepts should not be limitedly interpreted by a structure and layout of the plurality of banks 150.

The memory cell array 151 includes a plurality of word lines (or row lines), a plurality of bit lines (or column lines), and a plurality of memory cells for storing data.

The sense amplifiers & write driver block 152, when the memory device 100 perform a read operation, may operate as a sense amplifier sensing and amplifying a voltage change of each bit line. The sense amplifiers & write driver block 152, when the memory device 100 performs a write operation, may operate as a write driver which may drive each of the plurality of bit lines included in the memory cell array 151.

The input/output gate 154 may transmit data signals output from the sense amplifiers & write driver block 152 to the first input/output interface 120 in response to a column selection signal output from one of the plurality of column decoders 144. According to an example embodiment, the input/output gate 154 may transmit data signals input through the first input/output interface 120 to the sense amplifiers & write driver block 152 in response to the column selection signal.

According to an example embodiment, the input/output gate 154 may be included in the first input/output interface 120. The first input/output interface 120 may be controlled by a mode selection signal MSEL transmitted from the control logic 130. According to an example embodiment, circuits included in the first input/output interface 120 may be selectively used according to the mode selection signal MSEL.

According to an example embodiment, the mode selection signal MSEL may be generated by the control logic 130 based on data for controlling operation modes of the memory device 100 stored in the mode register 130-2. According to another example embodiment, the mode selection signal MSEL may be generated by the control logic 130 based on data about a memory latency stored in the mode register 130-2. The memory latency may be read latency or write latency.

According to an example embodiment, the mode selection signal MSEL may be generated by the control logic 130 based on data about an operation frequency stored in the mode register 130-2. According to still another example embodiment, the mode selection signal MSEL may be generated by the control logic 130 based on a mode register set (MRS) command for adjusting an operation frequency.

According to an example embodiment, the mode selection signal MSEL may be a control signal for controlling an ODT circuit (not shown) generated by the control logic 130. In this case, the first internal circuit 110 may further include an anti-fuse (not shown) for storing information for controlling the ODT circuit.

According to an example embodiment, the memory device 100 may include a separate unit (not shown) for generating a mode selection signal (MSEL). The first input/output interface 120 will be described in detail referring to FIG. 4.

FIG. 3 is a block diagram according to another example embodiment of the memory device illustrated in FIG. 1. Referring to FIGS. 1 to 3, a memory device [100'] *100-2* according to another example embodiment of the memory device 100 illustrated in FIG. 1 is different from the memory device 100 of FIG. 2 in a transmission path of the mode selection signal MSEL.

The mode selection signal MSEL may be transmitted to the first input/output interface 120 from the SoC 200, e.g., a memory controller (not shown) included in the SoC 200, to the first input/output interface 120. According to an example embodiment, the SoC 200 may transmit a control signal for controlling the on-die termination (ODT) circuit included in the first input/output interface 120 to the memory device [100'] *100-2*, and the control signal may be input to the first input/output interface 120 as the mode selection signal MSEL.

Figure 4:
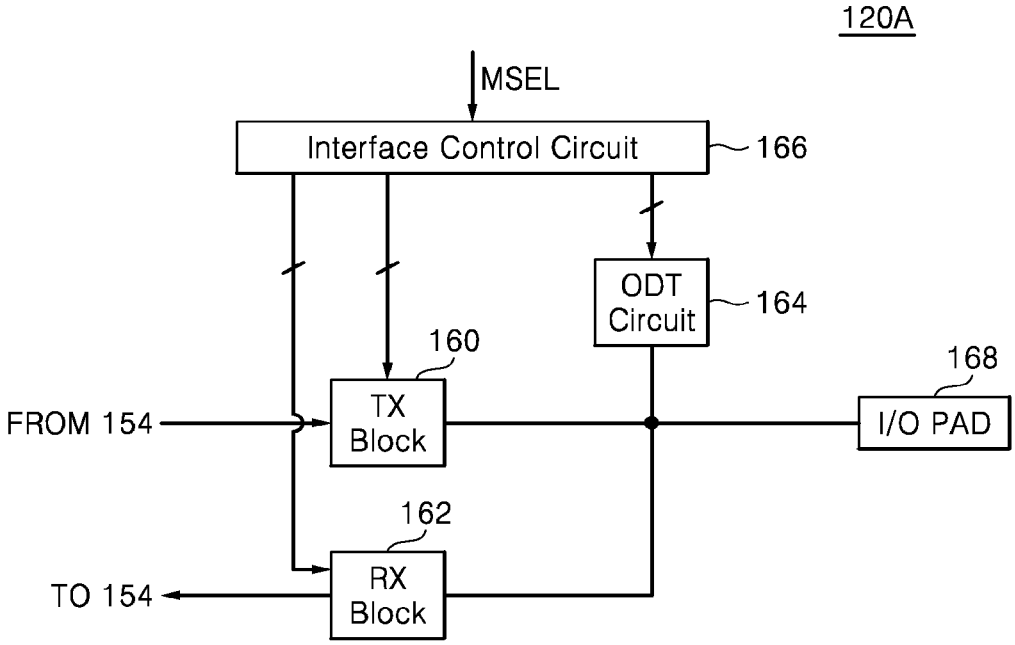
FIG. 4 is a block diagram according to an example embodiment of a first input/output interface illustrated in FIG. 2.

FIG. 4 is a block diagram according to an example embodiment of a first input/output interface illustrated in FIG. 2. Referring to FIGS. 1, 2, and 4, a first input/output interface 120A according to an example embodiment of the first input/output interface 120 illustrated in FIG. 2 may include an output driver (TX) block 160, an input receiver (RX) block 162, an ODT circuit 164, an interface control circuit 166, and an input/output (I/O) pad 168.

The output driver 160 may output a data signal transmitted from the input/output gate 154 to the outside of the memory device 100, e.g., the SoC 200, through the input/output pad 168. The output driver block 160 may include a plurality of output driver circuits, and this will be described referring to FIGS. 5 and 6.

The input receiver block 162 may receive and transmit a data signal input from the outside of the memory device 100 to the input/output gate 154 through the input/output pad 168. The input receiver block 162 may include a plurality of input receivers, and this will be described referring to FIGS. 7 to 12.

The ODT circuit 164 may be included in the first input/output interface 120A so as to solve impedance mismatching which may occur when outputting a data signal to the second input/output interface 220 or inputting the data signal from the second input/output interface 220.

The ODT circuit 164 in FIG. 4 is illustrated inside the first input/output interface 120A; however, the ODT circuit 164 may be embodied outside of the first input/output interface 120A or outside the memory device 100; and the technical scope of the inventive concepts are not limited by layout of the ODT circuit 164. The ODT circuit 164 will be described in detail referring to FIG. 16.

Figure 5:
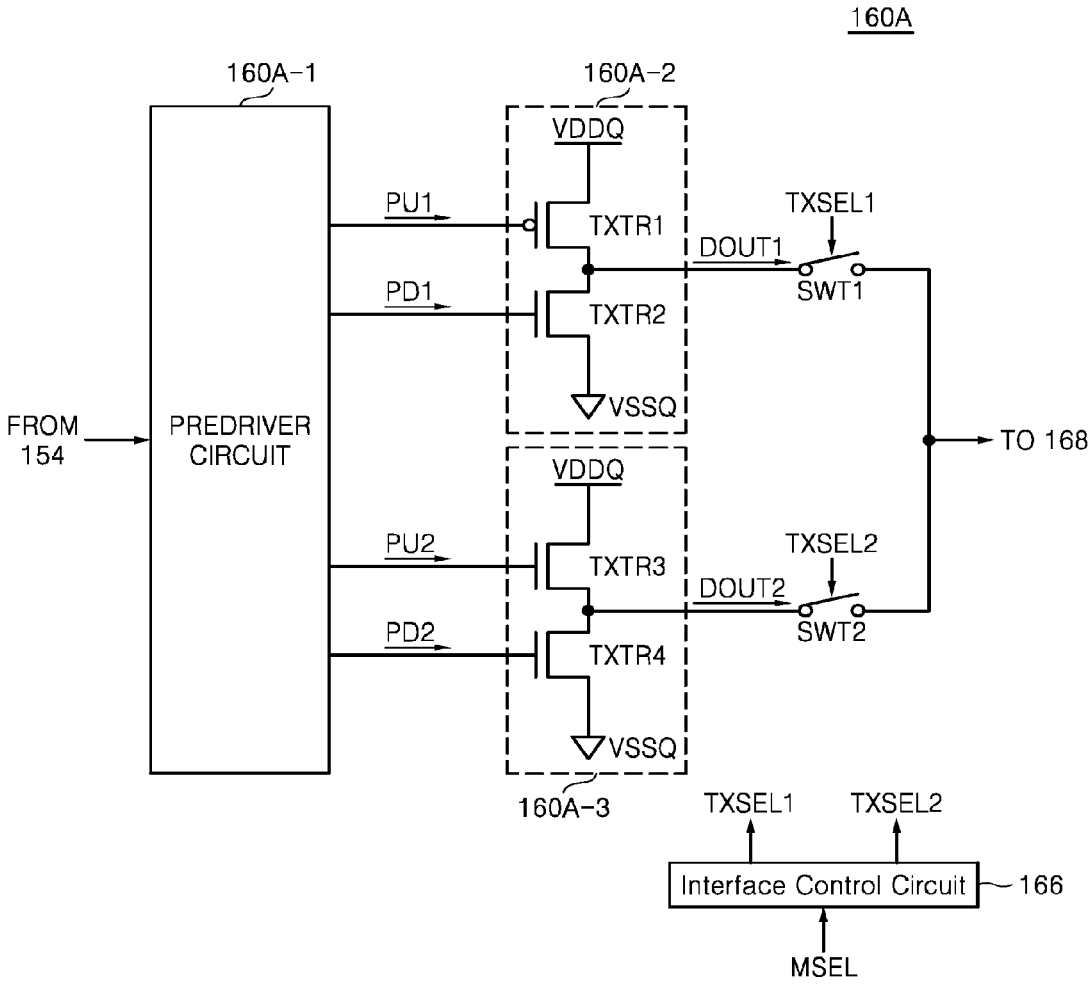
FIG. 5 is a circuit diagram according to an example embodiment of an output driver block illustrated in FIG. 4.

FIG. 5 is a circuit diagram according to an example embodiment of an output driver block illustrated in FIG. 4.

Referring to FIGS. 2, 4, and 5, an output driver block 160A according to an example embodiment of the output driver block 160 illustrated in FIG. 4 may include a pre-driver circuit 160A-1, a plurality of output driver circuits 160A-2 and 160A-3, and a plurality of switches SWT1 and SWT2.

The pre-driver circuit 160A-1 may receive a data signal transmitted from the input/output gate 154, and generate a plurality of pull-up signals PU1 and PU2 and a plurality of pull-down signals PD1 and PD2 based on the data signal.

A first output driver circuit 160A-2 may include a PMOS pull up transistor TXTR1 operating according to a first pull-up signal PU1 and a NMOS pull down transistor TXTR2 operating according to a first pull-down signal PD1. The first output driver circuit 160A-2 may output an output data signal DOUT1 based on the first pull-up signal PU1 and the first pull-down signal PD1.

The second output driver circuit 160A-3 may include a NMOS pull-up transistor TXTR3 operating according to a second pull-up signal PU2 and a NMOS pull-down transistor TXTR4 operating according to a second pull-down signal PD2. The second output driver circuit 160A-3 may output an output data signal DOUT2 based on the second pull-up signal PU2 and the second pull-down signal PD2.

An interface control circuit 166 may generate selection signals TXSEL1 and TXSEL2 based on the mode selection signal MSEL. Each of switches SWT1 and SWT2 may be switched by each of the selection signals TXSEL1 and TXSEL2 output from the interface control circuit 166. According to an example embodiment, when the mode selection signal MSEL indicates an operation mode for a high speed operation, a first switch SWT1 may be turned off by the first selection signal TXSEL1 and a second switch SWT2 may be turned on by the second selection signal TXSEL2.

According to another example embodiment, when the mode selection signal MSEL indicates an operation mode for a low speed operation, the first switch SWT1 may be turned on by the first selection signal TXSEL1 and the second switch SWT2 may be turned off by the second selection signal TXSEL2. That is, the first output driver circuit 160A-2 including the PMOS pull-up transistor TXTR1 may be used in an operation mode for a low speed operation, and the second output driver circuit 160A-3 including the NMOS pull-up transistor TXTR3 may be used in an operation mode for a high speed operation.

According to an example embodiment, each of the first pull up signal PU1 and the second pull-up signal PU2 may be a signal the same as the first selection signal TXSEL1 or the second selection signal TXSEL2, or a signal generated based on the first selection signal TXSEL1 or the second selection signal TXSEL2. The first pull-up signal PU1 and the second pull-up signal PU2 may have the same phase or opposite phase. According to another example embodiment, the pre-driver circuit 160A-1 may further include a phase inversion circuit so that the first pull-up signal PU1 and the second pull-up signal PU2 may have opposite phases.

Figure 6:
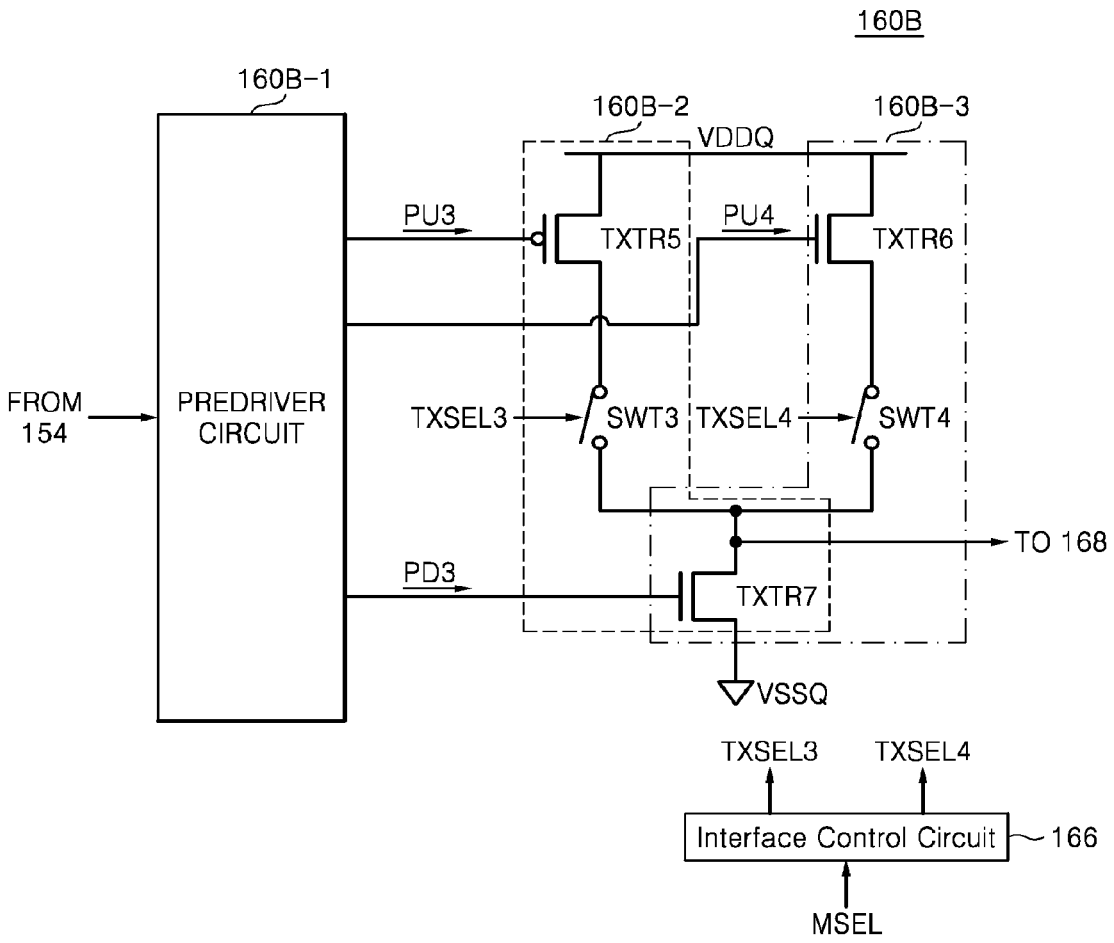
FIG. 6 is a circuit diagram according to another example embodiment of the output driver block illustrated in FIG. 4.

FIG. 6 is a circuit diagram according to another example embodiment of the output driver block illustrated in FIG. 4. Referring to FIGS. 4 to 6, an output driver block 160B according to another example embodiment of the output driver block 160 illustrated in FIG. 4 may include a pre-driver circuit 160B-1 and a plurality of output driver circuits 160B-2 and 160B-3.

The pre-driver circuit 160B-1 may receive a data signal transmitted from the input gate 154 and generate a plurality of pull-up signals PU3 and PU4 and a pull down signal PD3 based on the data signal.

A first output driver circuit 160B-2 is substantially the same as the first output driver circuit 160A-2 of FIG. 5, and a second output driver circuit 160B-3 is substantially the same as the second output driver circuit 160A-3 of FIG. 5. The first output driver circuit 160B-2 and the second output driver circuit 160B-3 commonly use a NMOS pull-down transistor TXTR7.

The interface control circuit 166 may generate output driver selection signals TXSEL3 and TXSEL4 based on the mode selection signal MSEL.

Each of the switches SWT3 and SWT4 may be switched by each of the output driver selection signals TXSEL3 and TXSEL4 output from the interface control circuit 166.

According to an example embodiment, when the mode selection signal MSEL indicates an operation mode for a high speed operation, a third switch SWT3 may be turned off by the third output driver selection signal TXSEL3, and a fourth switch SWT4 may be turned on by the fourth output driver selection signal TXSEL4.

According to an example embodiment, when the mode selection signal MSEL indicates an operation mode for a low speed operation, the third switch SWT3 may be turned on by the third output driver selection signal TXSEL3, and the fourth switch SWT4 may be turned off by the fourth output driver selection signal TXSEL4. That is, the first output driver circuit 160B-2 including a PMOS pull-up transistor TXTR5 may be used in an operation mode for a low speed operation, and the second output driver circuit 160B-3 including a NMOS pull-up transistor TXTR6 may be used in an operation mode for a high speed operation.

According to an example embodiment, each of a third pull-up signal PU3 and a fourth pull-up signal PU4 may be a signal the same as the third selection signal TXSEL3 or the fourth selection signal TXSEL4, or a signal generated based on the third selection signal TXSEL3 or the fourth selection signal TXSEL4. The third pull-up signal PU3 and the fourth pull-up signal PU4 may have the same phase or opposite phases.

According to an example embodiment, the pre-driver circuit 160B-1 may further include a phase inversion circuit so that the third pull-up signal PU3 and the fourth pull-up signal PU4 may have opposite phases.

Figure 7:
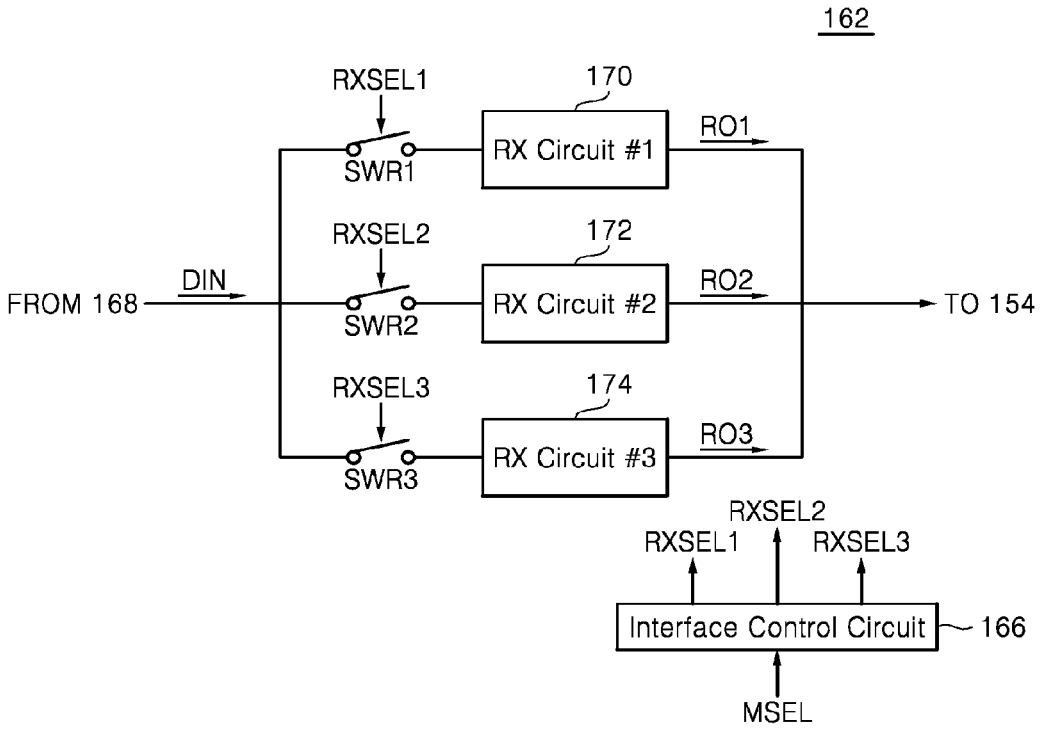
FIG. 7 is a block diagram according to an example embodiment of the input receiver block illustrated in FIG. 4.

FIG. 7 is a block diagram according to an example embodiment of the input receiver block illustrated in FIG. 4. Referring to FIGS. 4 and 7, the input receiver block 162 may include a plurality of switches SWR1 to SWR3 and a plurality of input receiver circuits 170, 172, and 174.

The interface control circuit 166 may generate a plurality of input receiver selection signals RXSEL1 to RXSEL3 according to the mode selection signal MSEL. Each of the switches SWR1 to SWR3 may select one of the input receiver circuits 170, 172, and 174 according to each of the input receiver selection signals RXSEL1 to RXSEL3.

According to an example embodiment, a first input receiver circuit 170 may have a structure suitable for an operation mode for a high speed operation, a second input receiver circuit 172 may have a structure suitable for an operation mode for an intermediate speed operation, and a third input receiver circuit 174 may have a structure suitable for an operation mode for a low speed operation.

That is, when the mode selection signal MSEL indicates an operation mode for a high speed operation, the first switch SWR1 may be turned on according to the first input receiver selection signal RXSEL1, and each of the remaining switches SWR2 and SWR3 may be turned off according to each of the input receiver selection signals RXSEL2 and RXSEL3.

In the same manner, the second input receiver 172 may be selected in an operation mode for an intermediate speed operation, and the third input receiver 174 may be selected in an operation mode for a low speed operation.

The first input receiver circuit 170, the second input receiver 172, or the third input receiver 174 may receive an input data signal DIN transmitted from the input/output pad 168, and output a first receiving data signal RO1, a second receiving data signal RO2, or a third receiving data signal RO3 based on the received input data signal DIN.

According to an example embodiment, the input receiver block 162 may include only two of the input receiver circuits 170, 172, and 174. According to another example embodiment, the input receiver block 162 may further include input receiver circuits (not shown) in addition to the input receiver circuits 170, 172, and 174. In this case, the input receiver block 162 may selectively use one of four or more input receiver circuits.

A structure of each of the input receiver circuits 170, 172, and 174 will be described in detail referring to FIGS. 8 to 12.

Figure 8:
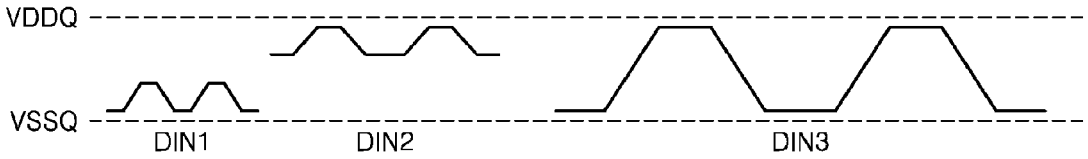
FIG. 8 is an exemplary wave form diagram of a data signal input to the input receiver block illustrated in FIG. 7.

FIG. 8 is an exemplary wave form diagram of a data signal input to the input receiver block illustrated in FIG. 7. Referring to FIGS. 7 and 8, with respect to an input data signal DIN1 having a high frequency and whose signal level swings near a ground voltage level VSSQ, the first input receiver 170 may be selected and used.

With respect to an input data signal DIN2 having an intermediate frequency and whose signal level swings near a supply voltage level VDDQ, the second input receiver 172 may be selected and used. With respect to an input data signal DIN3 whose frequency is low and whose signal level largely swings between the ground voltage level VSSQ and the supply voltage level VDDQ, the third input receiver 174 may be selected and used.

Figure 9:
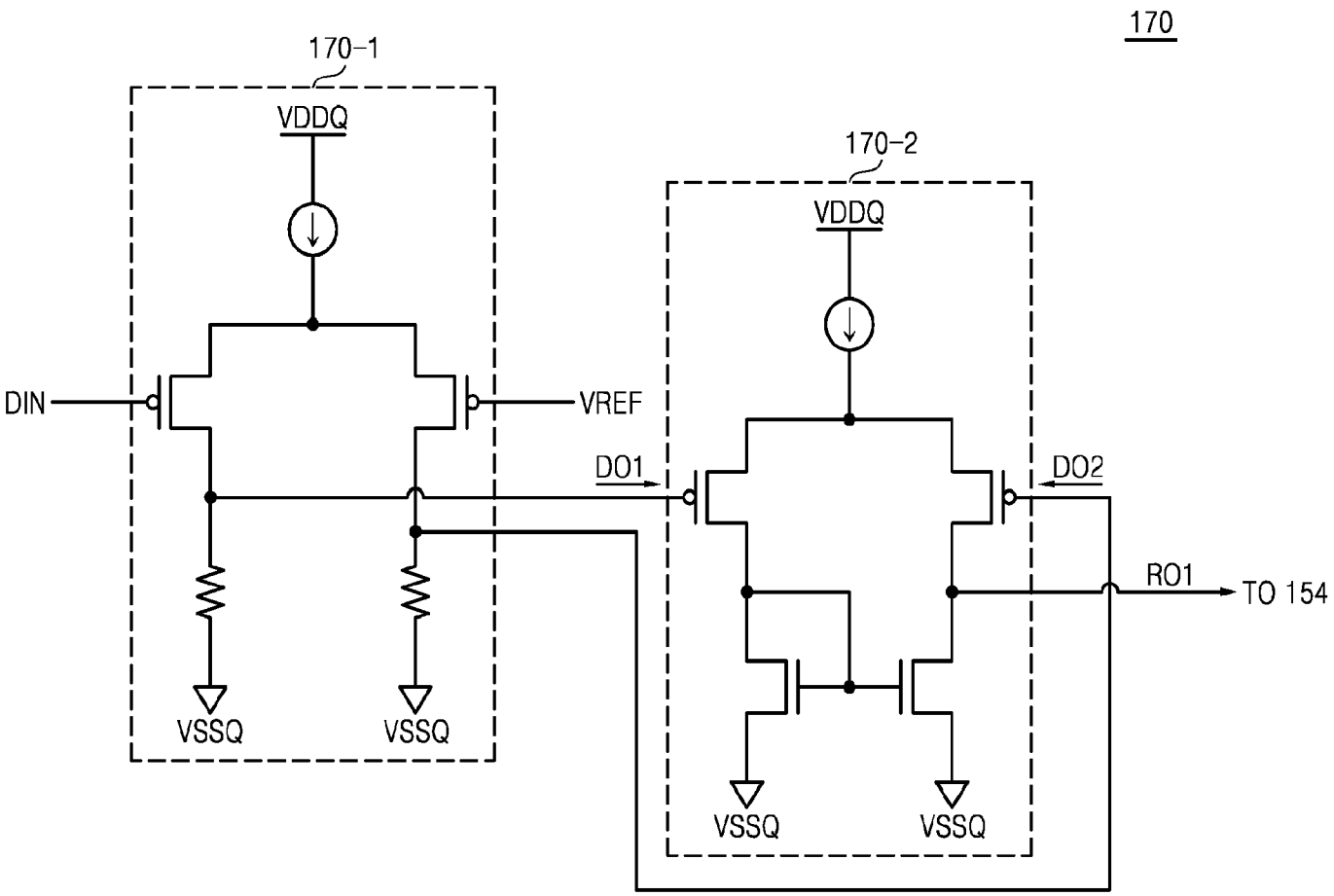
FIG. 9 is a circuit diagram according to an example embodiment of a first input receiver circuit illustrated in FIG. 7.

FIG. 9 is a circuit diagram according to an example embodiment of a first input receiver circuit illustrated in FIG. 7. Referring to FIGS. 7 and 9, the first input receiver circuit 170 may have a structure having a plurality of stages (e.g., at least two stages).

For convenience of description in FIG. 9, a structure in which the first input receiver circuit 170 has two stages is illustrated; however, a scope of a right of the inventive concepts should not be limitedly interpreted by the number of stages.

A first stage 170-1 outputs data signals DO1 and DO2 based on the input data signal DIN which is input and a reference voltage signal VREF. A second stage 170-2 may transmit the receiving data signal RO1 to the input/output gate 154 based on the data signals DO1 and DO2 output from the first stage 170-1.

As illustrated in FIG. 9, each of the first stage 170-1 and a second stage 170-2 may be embodied in a P-type differential amplifier; however, example embodiments of the structure of the first input receiver circuit 170 are not limited thereto. For example, the second stage 170-2 may be embodied in a N-P type differential amplifier instead of a P type differential amplifier. An exemplary structure of the N-P type differential amplifier is illustrated in FIG. 11.

Figure 10:
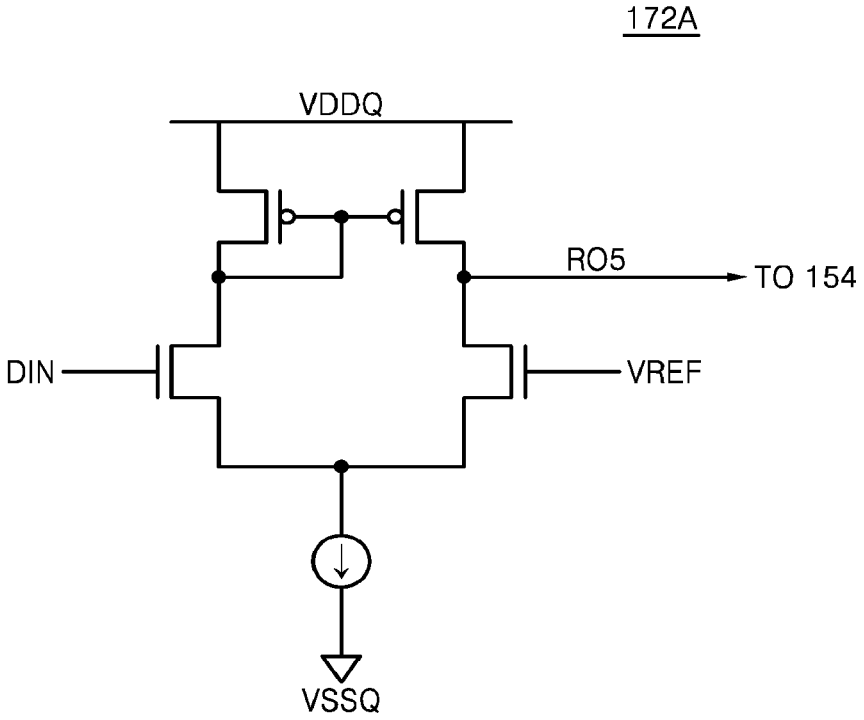
FIG. 10 is a circuit diagram according to an example embodiment of a second input receiver circuit illustrated in FIG. 7.

FIG. 10 is a circuit diagram according to an example embodiment of a second input receiver circuit illustrated in FIG. 7. Referring to FIGS. 7 and 10, a second input receiver circuit 172A according to an example embodiment of the second input receiver circuit 172 illustrated in FIG. 7 may output a receiving data signal RO2 based on the input data signal DIN and the reference voltage signal VREF.

Figure 11:
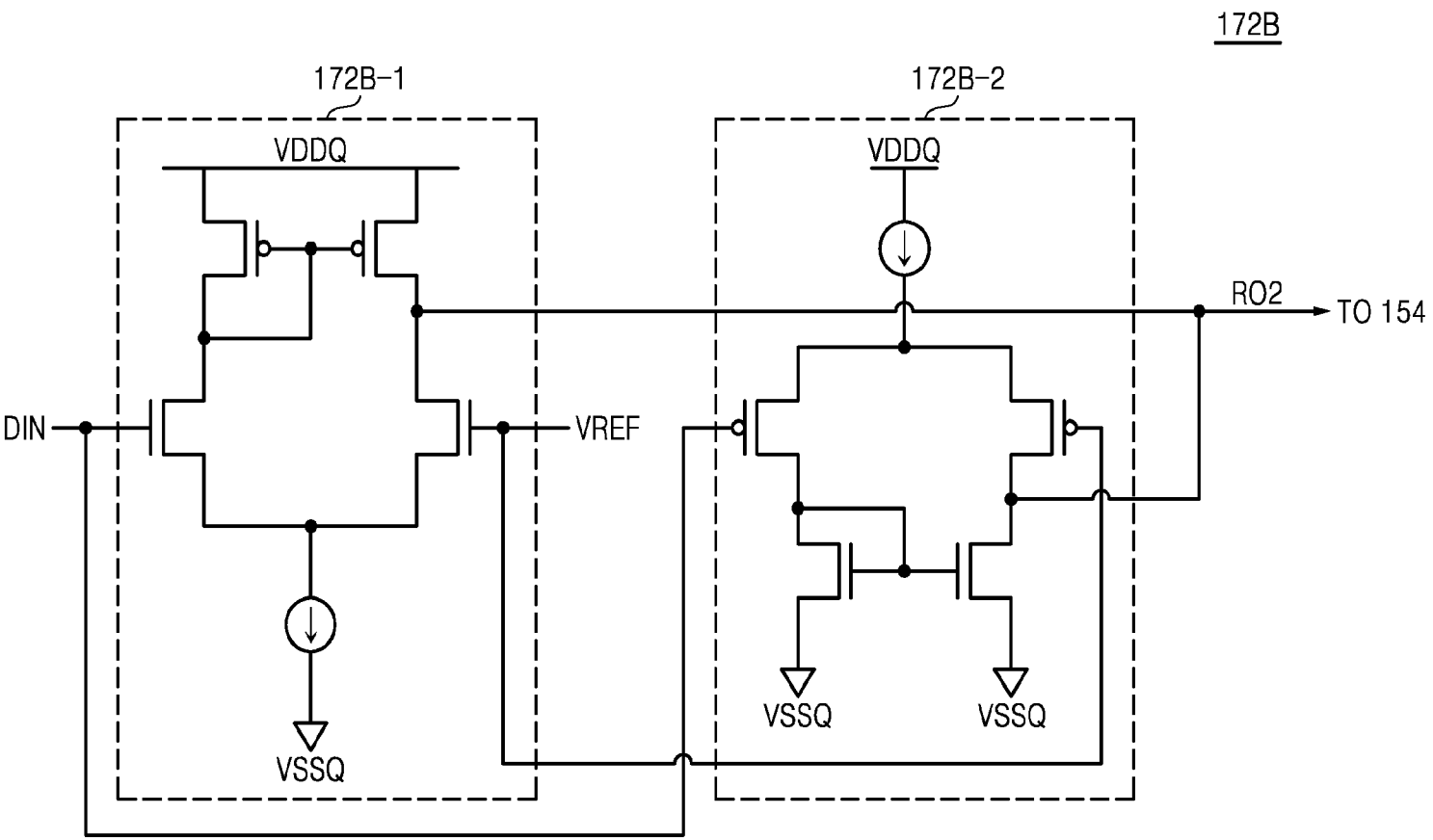
FIG. 11 is a circuit diagram according to another example embodiment of the second input receiver circuit illustrated in FIG. 7.

FIG. 11 is a circuit diagram according to another example embodiment of the second input receiver circuit illustrated in FIG. 7. Referring to FIGS. 7 and 11, a second input receiver circuit 172B according to another example embodiment of the second input receiver circuit 172 illustrated in FIG. 7 may be embodied in a N-P type differential amplifier configured to have a combination of a N type differential amplifier 172B-1 and a P type differential amplifier 172B-2.

The input data signal DIN and the reference voltage signal VREF are input to each of the N type differential amplifier 172B-1 and P type differential amplifier 172B-2. The second receiver circuit 172B may output a receiving data signal RO2 based on the input data signal DIN and the reference voltage signal VREF which are input. The second input receiver circuit 172A or 172B may be embodied in the N type differential amplifier or the N-P type differential amplifier; however, a structure of the second input receiver circuit 172 is not limited thereto.

Figure 12:
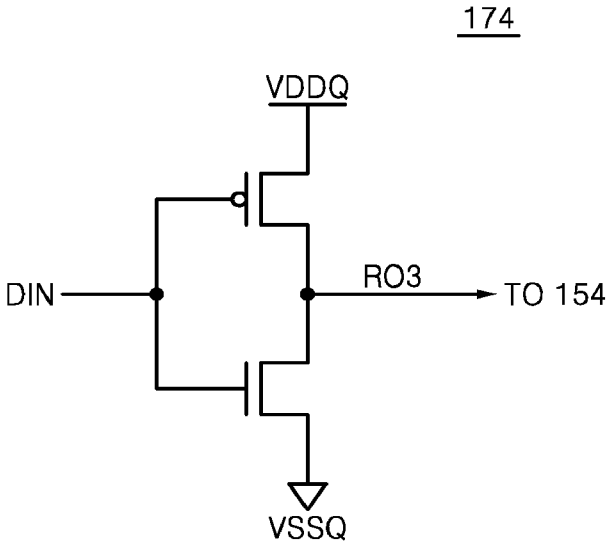
FIG. 12 is a circuit diagram according to an example embodiment of a third input receiver circuit illustrated in FIG. 7.

FIG. 12 is a circuit diagram according to an example embodiment of a third input receiver circuit illustrated in FIG. 7. Referring to FIGS. 7 and 12, a third input receiver circuit 174 may be embodied in a CMOS inverter including different types of MOS transistors which are connected in series.

The third input receiver circuit 174 may receive the input data signal DIN and output a receiving data signal RO3 based on the received input data signal DIN.

Figure 13:
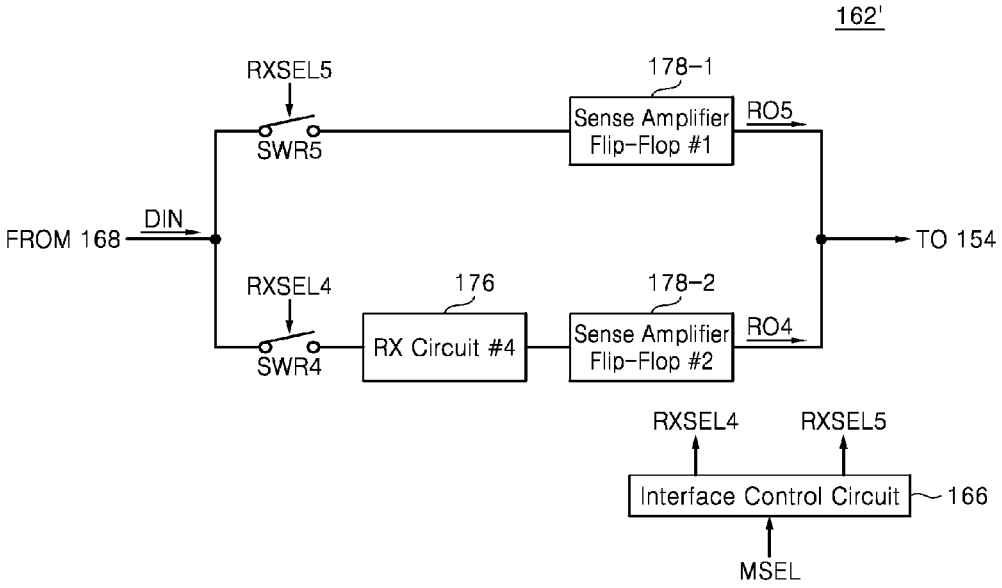
FIG. 13 is a block diagram according to another example embodiment of the input receiver block illustrated in FIG. 4.
Figure 14:
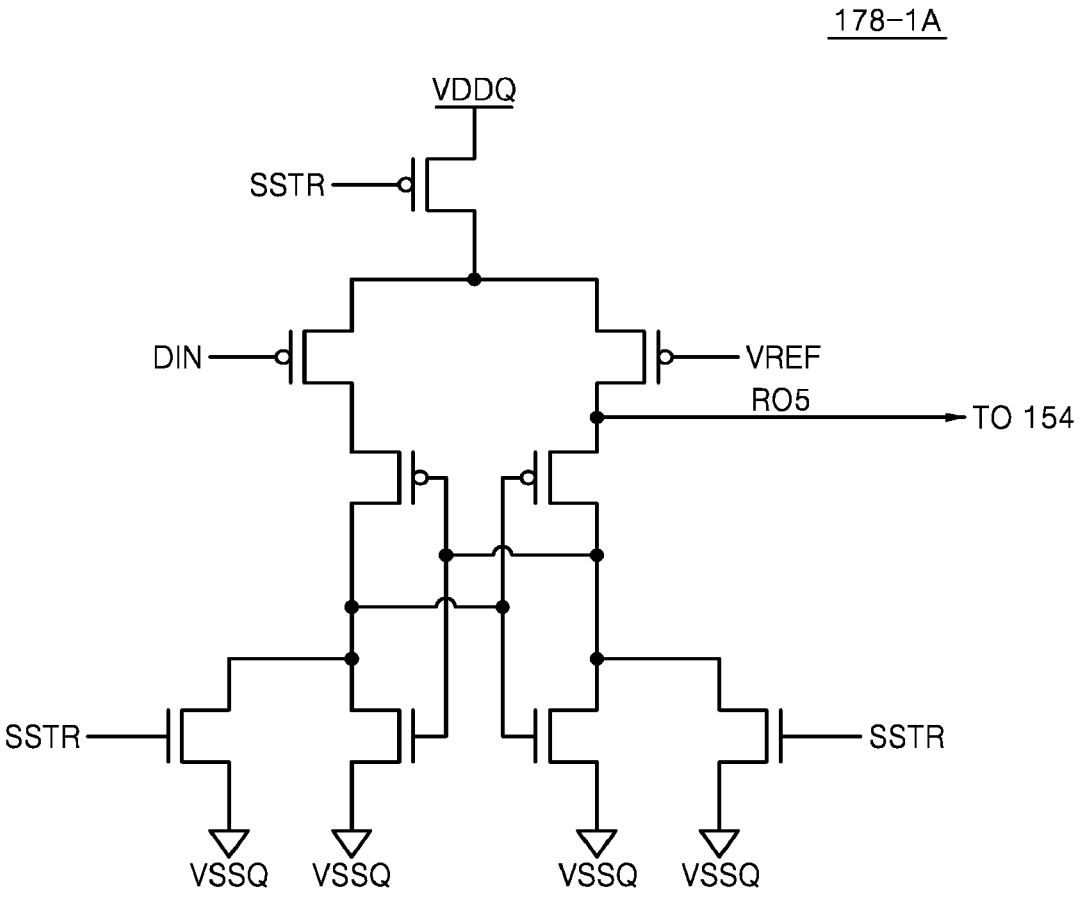
FIG. 14 is a circuit diagram according to an example embodiment of a sense amplifier flip-flop of FIG. 13.
Figure 15:
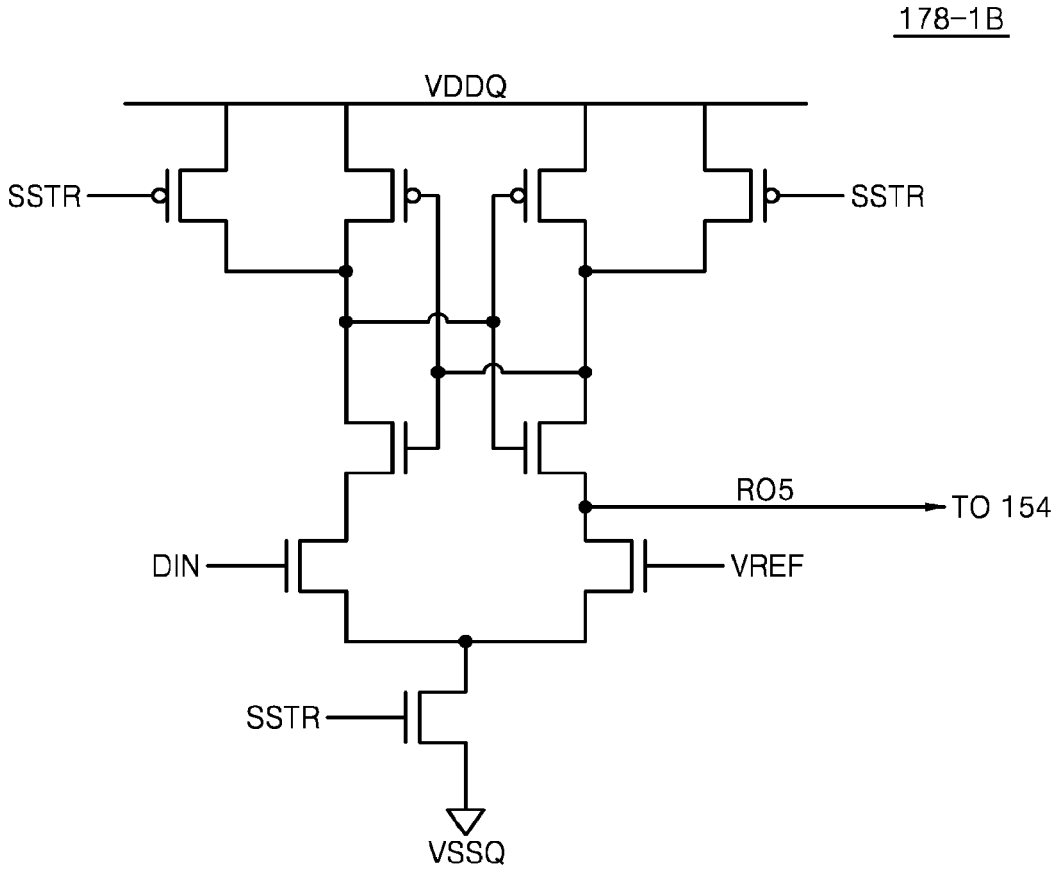
FIG. 15 is a circuit diagram according to another example embodiment of the sense amplifier flip-flop of FIG. 13.

FIG. 13 is a block diagram according to another example embodiment of the input receiver block illustrated in FIG. 4. FIG. 14 is a circuit diagram according to an example embodiment of a sense amplifier flip-flop of FIG. 13. FIG. 15 is a circuit diagram according to another example embodiment of the sense amplifier flip-flop of FIG. 13. Referring to FIGS. 4 and 13, an input receiver block 162' according to another example embodiment of the input receiver block 162 of FIG. 4 may include switches SWR4 and SWR5, a fourth input receiver circuit 176, and sense amplifier flip-flops 178-1 and 178-2.

The interface control circuit 166 may generate a plurality of input receiver selection signals RXSEL4 and RXSEL5 according to the mode selection signal MSEL. For example, the interface control circuit 166 may generate the plurality of input receiver selection signals RXSEL4 and RXSEL5 according to the mode selection signal MSEL including information on a level and/or a frequency of the input data signal DIN.

Each of the switches SWR4 and SWR5 may select a transmission path of the input data signal according to each of the input receiver selection signals RXSEL4 and RXSEL5.

When a fourth switch SWR4 is turned on, a fifth switch SWR5 may be turned off, and when the fourth switch SWR4 is turned off, a fifth switch SWRS may be turned on.

According to an example embodiment, when the fourth switch SWR4 is turned on, the input data signal DIN may be output as a fourth receiving data signal RO4 through the fourth input receiver circuit 176 and a second sense amplifier flip-flop 178-2. According to another example embodiment, when the fifth switch SWR5 is turned on, the input data signal DIN may be output through a first sense amplifier flip-flop 178-1 as the fifth receiving data signal RO5.

The fourth input receiver circuit 176 may be embodied in the first input receiver circuit 170 of FIG. 9, the second input receiver 172A of FIG. 10, the second input receiver circuit 172B of FIG. 11, or the third input receiver circuit 174 of FIG. 12.

Each of the sense amplifier flip-flops 178-1 and 178-2 may sample the input data signal DIN based on a sampling strobe signal SSTR of FIG. 14 or 15. The sampling strobe signal SSTR may widely denote a clock signal used so as to sample the input data signal DIN. For example, a data strobe signal DQS may be used as a sampling strobe signal SSTR.

The sampled input data signal DIN may be output to an input/output gate 154 as the fourth receiving data signal RO4 or the fifth receiving data signal RO5.

Referring to FIG. 14, a first sense amplifier flip-flop 178-1A according to an example embodiment of the first sense amplifier flip-flop 178-1 (e.g., P type sense amplifier flip-flop), is illustrated. According to an example embodiment, a second sense amplifier flip-flop 178-2 may have a structure the same as the first amplifier flip-flop 178-1A.

The input data signal DIN may be sampled based on the reference voltage signal VREF which is a reference of comparison with the input data signal DIN and a sampling strobe signal SSTR which is a reference of sampling. According to a result of the sampling, the fifth receiving data signal RO5 may be output.

Referring to FIG. 15, a first sense amplifier flip-flop 178-1B according to another example embodiment of the first sense amplifier flip-flop 178-1 (e.g., N type sense amplifier flip-flop), is illustrated. According to an example embodiment, the second sense amplifier flip-flop 178-2 may have the same structure as the first sense amplifier flip-flop 178-1B.

The input data signal DIN may be sampled based on the reference voltage signal VREF which is a reference of comparison with the input data signal DIN and a sampling strobe signal SSTR which is a reference of sampling. According to a result of the sampling, the fifth receiving data signal R05 may be output. According to an example embodiment, when a buffer circuit (not shown) including a plurality of inverters is connected between the fourth input receiver circuit 176 and the second sense amplifier flip-flop 178-2, the input data signal DIN at a high voltage level may be input to the second sense amplifier flip-flop 178-2. In this case, the second sense amplifier flip-flop 178-2 may have a structure the same as the N type sense amplifier flip-flop (e.g., the first sense amplifier flip-flop 178-1B of FIG. 15).

Figure 16:
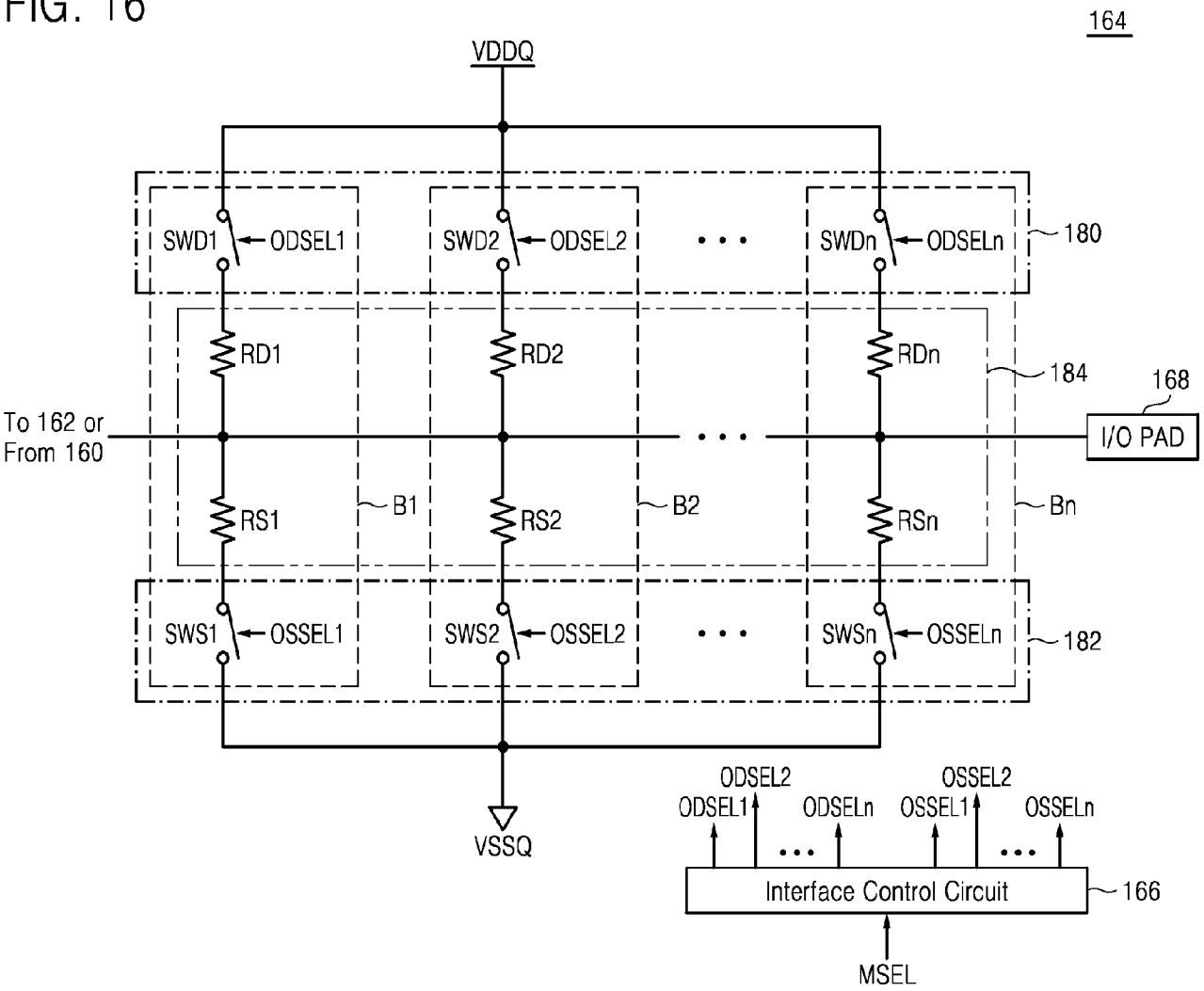
FIG. 16 is a circuit diagram according to an example embodiment of the on-die termination (ODT) circuit of FIG. 4.

FIG. 16 is a circuit diagram according to an example embodiment of the on-die termination (ODT) circuit of FIG. 4. Referring to FIGS. 4 and 16, the ODT circuit 164 includes a plurality of branches B1 to Bn, where n is a natural number. A branch B1 includes a first switch SWD1, a first resistance RS1, a second resistance RS2, and a second switch SWS1.

According to an example embodiment, the first switch SWD1 may be embodied in a PMOS transistor, and the second switch SWS1 may be embodied in a NMOS transistor.

A termination resistance 184 may have a resistance value according to a combination of a plurality of resistances RD1 to RDn and RS1 to RSn as each of the plurality of switches SWD1 to SWDn and SWS1 to SWSn, where n is a natural number, is switched. A VDDQ termination switch array 180 may include a plurality of switches SWD1 to SWDn.

Each of the plurality of switches SWD1 to SWDn included in a VDDQ termination switch array 180 may be turned on or turned off in response to each of the ODT selection signals ODSEL1 to ODSELn output from the interface control circuit 166. The VSSQ termination switch array 182 may include a plurality of switches SWS1 to SWSn.

Each of the plurality of switches SWS1 to SWSn included in the VSSQ termination switch array 182 may be turned on or off in response to each of the ODT selection signals OSSEL1 to OSSELn output from the interface control circuit 166.

The ODT circuit 164 may have various resistance values of the termination resistance 184 according to the ODT selection signals ODSEL1 to ODSELn and OSSEL1 to OSSELn.

According to an example embodiment, when the mode selection signal MSEL indicates an operation mode for a high speed operation, the ODT circuit 164 may be terminated at a ground voltage level VSSQ. That is, only a portion of the switches SWS1 to SWSn may be turned on.

According to an example embodiment, when the mode selection signal MSEL indicates an operation mode for a low speed operation, according to the ODT selection signals ODSEL1 to ODSELn and OSSEL1 to OSSELn, the ODT circuit 164 may be terminated at a supply voltage level VDDQ. That is, only a portion of the switches SWD1 to SWDn may be turned on.

According to an example embodiment, when the mode selection signal MSEL indicates an operation mode for a low speed operation, according to the ODT selection signals ODSEL1 to ODSELn and OSSEL1 to OSSELn, the switches SWD1 to SWDn and SWS1 to SWSn of the ODT circuit 164 may be all turned off. That is, the termination resistance 184 may not be used in the operation mode for a low speed operation. According to still another example embodiment, a portion of the switches SWD1 to SWDn and a portion of the switches SWS1 to SWSn may be turned on together, and in this case the ODT circuit 164 may be embodied in a center tap termination (CTT).

Figure 17:
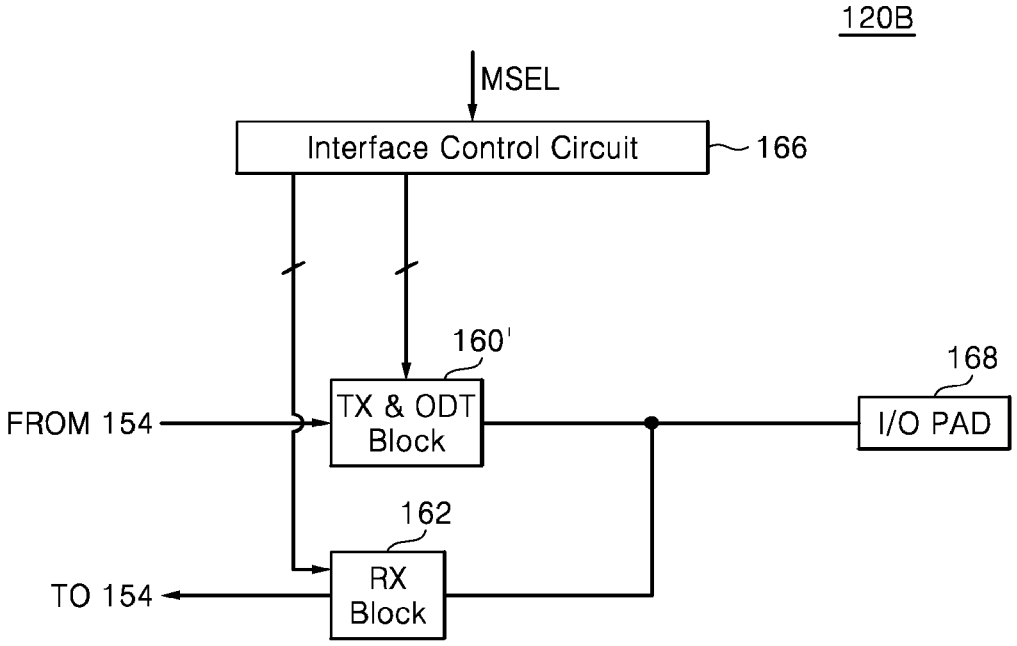
FIG. 17 is a block diagram according to another example embodiment of the first input/output interface of FIG. 2.

FIG. 17 is a block diagram according to another example embodiment of the first input/output interface of FIG. 2. Referring to FIGS. 2, 4, and 17, in the first input/output interface 120B according to another example embodiment of the first input/output interface 120 illustrated in FIG. 2, an output driver block (160 of FIG. 4) and the ODT circuit (164 of FIG. 4) may be embodied in an output driver and ODT block (160' of FIG. 17).

The output driver and ODT block 160' may operate like the output driver block 160 when the memory device 100 outputs a data signal, and operate like the ODT circuit 164 when the memory device 100 receives a data signal. That is, the first input/output interface 120B may not include an additional ODT circuit 164 as illustrated in FIG. 4 and use an output driver as the ODT circuit.

According to an example embodiment, the input receiver block 162 of FIG. 4 and the ODT circuit 164 of FIG. 4 may be combined and embodied in one block. In this case, the block may operate like the ODT circuit 164 when the memory device 100 outputs a data signal, and operate like the input receiver block 162 when the memory device 100 receives a data signal.

Figure 18:
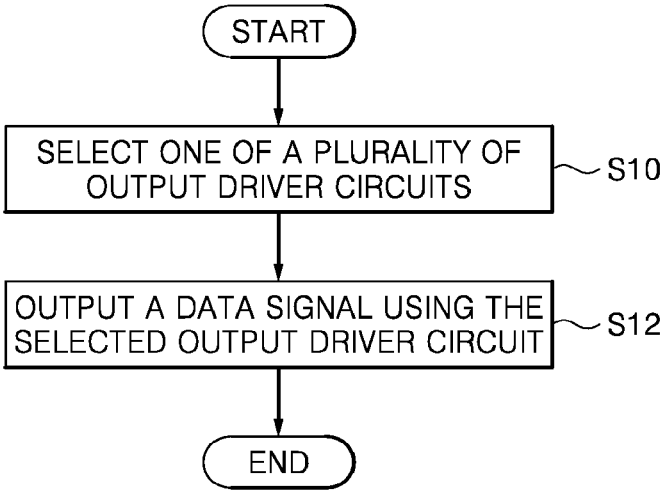
FIG. 18 is a flowchart of a method of operating an input/output interface according to an example embodiment of the inventive concepts.

FIG. 18 is a flowchart of a method of operating an input/output interface according to an example embodiment of the inventive concepts. Referring to FIGS. 4 to 6, and 18, in operation S10, the output driver block 160A and/or 160E selects one of a plurality of output driver circuits 160A-2, 160A-3, or 160B-2 and 160B-3.

According to an example embodiment, the output driver block 160A and/or 160B may select the one output driver circuit 160A-2 or 160A-3, 160B-2 or 160B-3 according to an output driver selection signal TXSEL1 to TXSEL4 generated by the interface control circuit 166 based on the mode selection signal MSEL. Then as shown in operation S12, the output driver block 160A or 160B outputs a data signal DOUT1 or DOUT2 using the selected output driver circuit 160A-2, 160A-3, 160B-2, or 160B-3.

Figure 19:
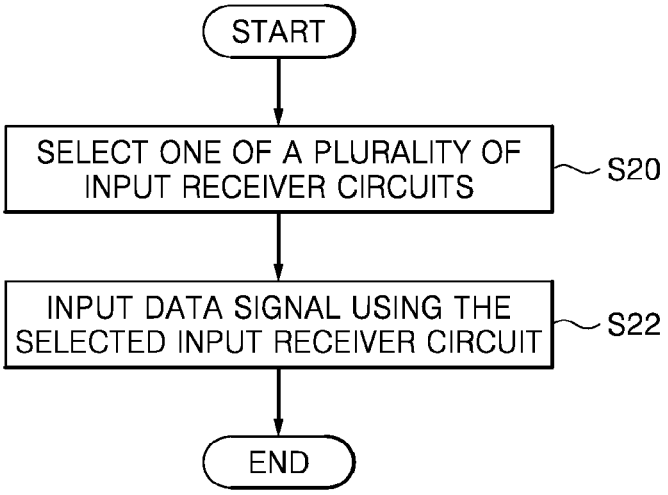
FIG. 19 is a flowchart of a method of operating an input/output interface according to another example embodiment of the inventive concepts.

FIG. 19 is a flowchart of a method of operating an input/output interface according to another example embodiment of the inventive concepts. Referring to FIGS. 7 and 19, in operation S20, the input receiver block 162 selects one of the plurality of input receiver circuits 170, 172, and 174 included in the input receiver block 162.

According to an example embodiment, the input receiver block 162, according to an input receiver selection signal RXSEL1 to RXSEL3 generated by the interface control circuit 166, may select the one input receiver circuit 170, 172, or 174 based on the mode selection signal MSEL. Then as shown in operation S22, the input receiver block 162 receives a data signal RO1 to RO3 using the selected input receiver circuit 170, 172, or 174.

Figure 20:
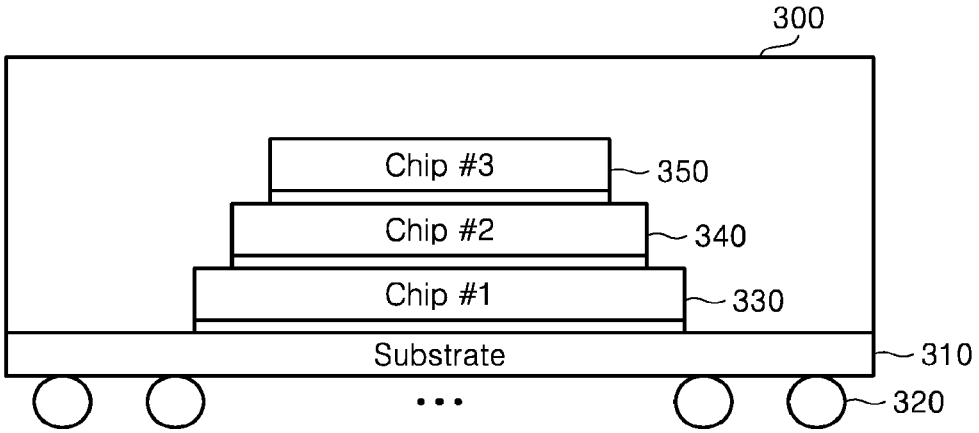
FIG. 20 is a conceptual diagram depicting an example embodiment of a package including the memory device illustrated in FIG. 1.

FIG. 20 is a conceptual diagram depicting an example embodiment of a package including the memory device illustrated in FIG. 1. Referring to FIGS. 1 and 20, a package 300 may include a plurality of semiconductor devices 330, 340, and 350 sequentially stacked on the package substrate 310. Each of the plurality of semiconductor devices 330 to 350 may be the memory device 100.

The package 300 may be embodied in a Package on Package (PoP), Ball Grid Arrays (BGAs), Chip Scale Packages (CSPs), Plastic Leaded Chip Carrier (PLCC), Plastic Dual In-Line Package (PDIP), Chip On Board (COB), CERamic Dual In-Line Package (CERDIP), plastic metric quad flat pack (MQFP), Thin Quad Flat Pack (TQFP), small-outline integrated circuit (SOIC), shrink small outline package (SSOP), thin small outline (TSOP), system in package (SIP), multi-chip package (MCP), wafer-level package (WLP), wafer-level processed stack package (WSP), or other like packages.

According to an example embodiment, a memory controller (not shown) may be embodied in one or more semiconductor device among a plurality of semiconductor devices 330 to 350, and embodied on a package substrate 310.

For an electrical connection between the plurality of semiconductor devices 330 to 350, electrical vertical connection means (e.g., Through-silicon via (TSV)), may be used.

The package 300 may be embodied in a hybrid memory cube (hereinafter, "HMC") of a structure where a memory controller and a memory cell array die are stacked. Embodiment in HMC may reduce power consumption and manufacturing cost by performance improvement of a memory device due to an increase in bandwidth and minimization of an area occupied by a memory device.

Figure 21:
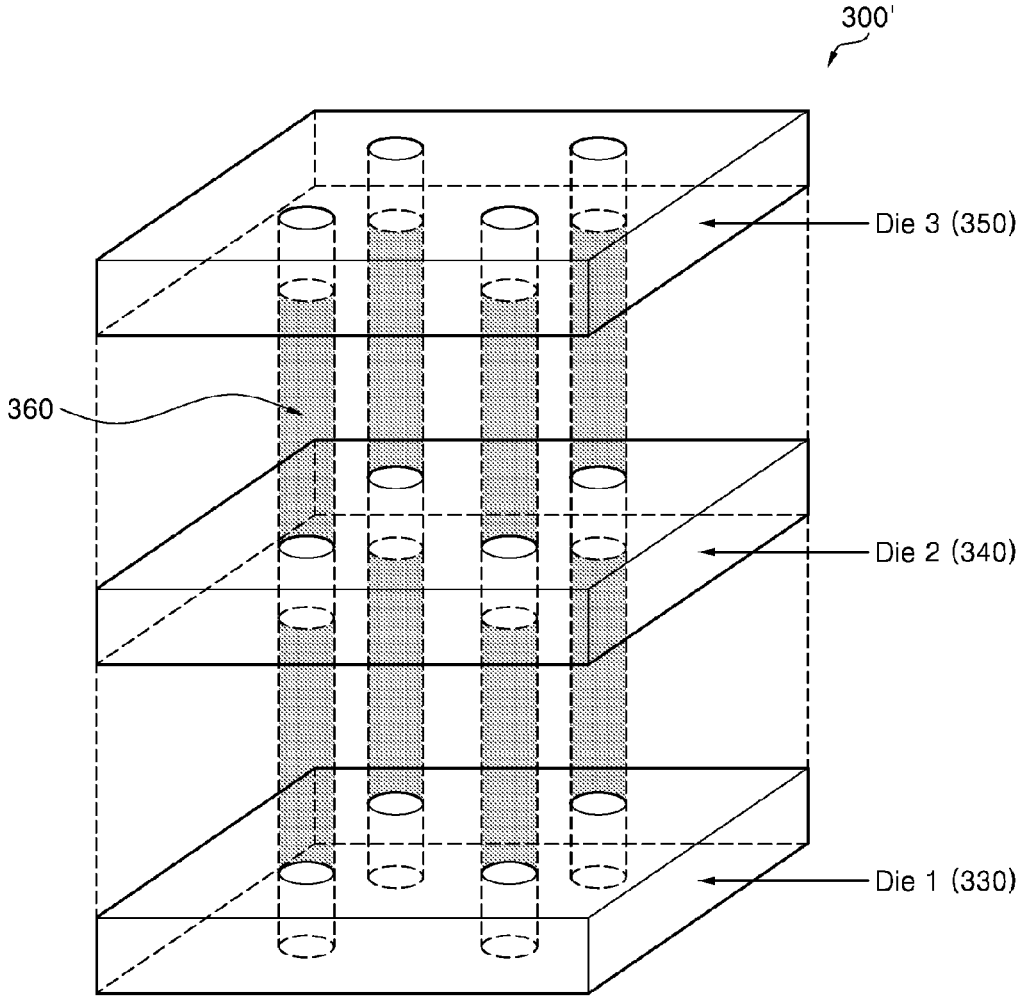
FIG. 21 is a conceptual diagram depicting tridimensionally an example embodiment of the package including the memory device illustrated in FIG. 1.

FIG. 21 is a conceptual diagram depicting an example embodiment of the package including the memory device illustrated in FIG. 1. Referring to FIGS. 1, 20, and 21, a package 300' includes a plurality of dies 330 to 350 of a stack structure where each is connected to each other through each TSV 360.

Figure 22:
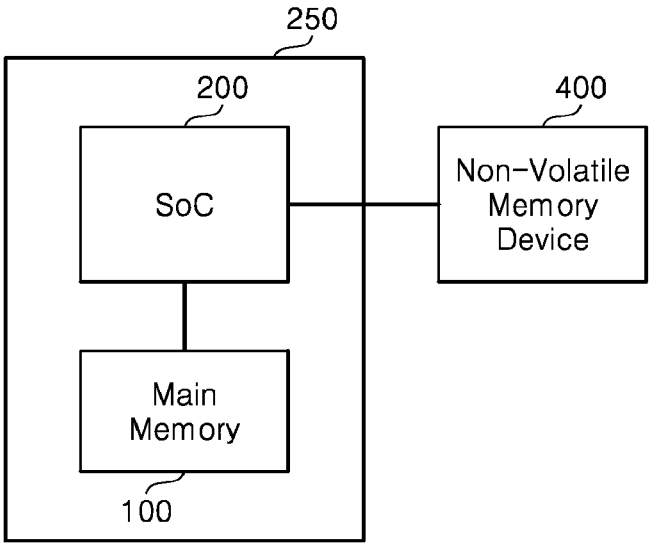
FIG. 22 is a block diagram according to an example embodiment of a system-in package including the memory system illustrated in FIG. 1 and a non-volatile memory device.
Figure 23:
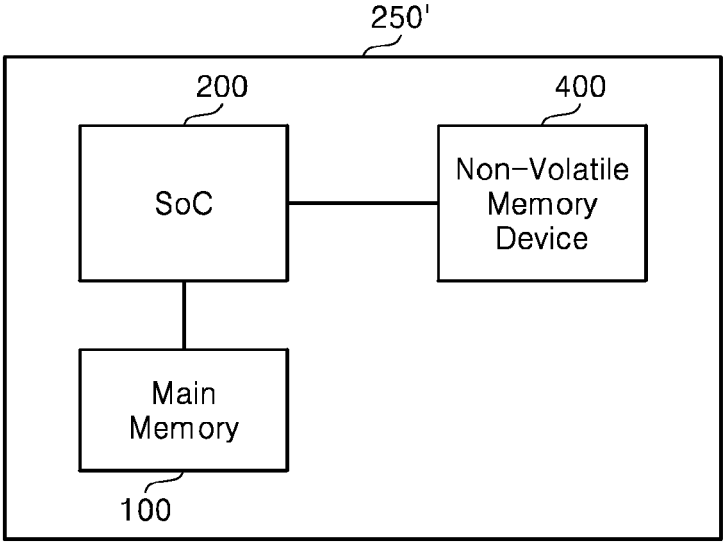
FIG. 23 is a block diagram according to another example embodiment of the system-in package including the memory system illustrated in FIG. 1.

FIG. 22 is a block diagram according to an example embodiment of a system-in package including the memory system illustrated in FIG. 1 and a non-volatile memory device. FIG. 23 is a block diagram according to another example embodiment of the system-in package including the memory system illustrated in FIG. 1.

Referring to FIGS. 1 and 22, the SoC 200 and a memory device 100 (e.g., a main memory), may be packaged in a system-in package (SiP) 250. The SoC 200 may be connected to a non-volatile memory device 400.

According to an example embodiment, the non-volatile memory device 400 may be embodied in an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, an insulator resistance change memory, and/or other like memory devices; however, the scope of the inventive concepts are not limited thereto.

Referring to FIGS. 1 and 23, a memory device 100, the SoC 200, and the non-volatile memory device 400 may be packaged in a SiP 250'.

FIG. 24 is a block diagram according to an example embodiment of the memory system including the memory device illustrated in FIG. 1. Referring to FIGS. 1 and 24, a memory system 500 may be embodied in a personal computer (PC), a tablet PC, or a mobile computing device.

The memory system 500 includes a main board 540, a slot 520 mounted on the main board 540, a memory module 510 which may be inserted to the slot 520, a chipset 530 which may control an operation of a plurality of memory devices 100-1 to 100-m mounted on the memory module 510 through the slot 520, a processor 550 which may communicate with [the] *a* plurality of *various* memory devices [100-1] *100, 100-2,* to 100-m. Each of the plurality of *various* memory devices [100-1] *100, 100-2,* to 100-m may be the memory device 100 illustrated in FIG. 1.

For convenience of description in FIG. 24, there is illustrated only one memory module 510; however, the memory system 500 includes at least one or more memory module.

The chipset 530 is used to transmit or receive data, an address, or control signals between the processor 550 and the memory module 510. The chipset 530 includes a memory controller 535 for controlling the plurality of memory devices 100-1 to 100-m.

Figure 25:
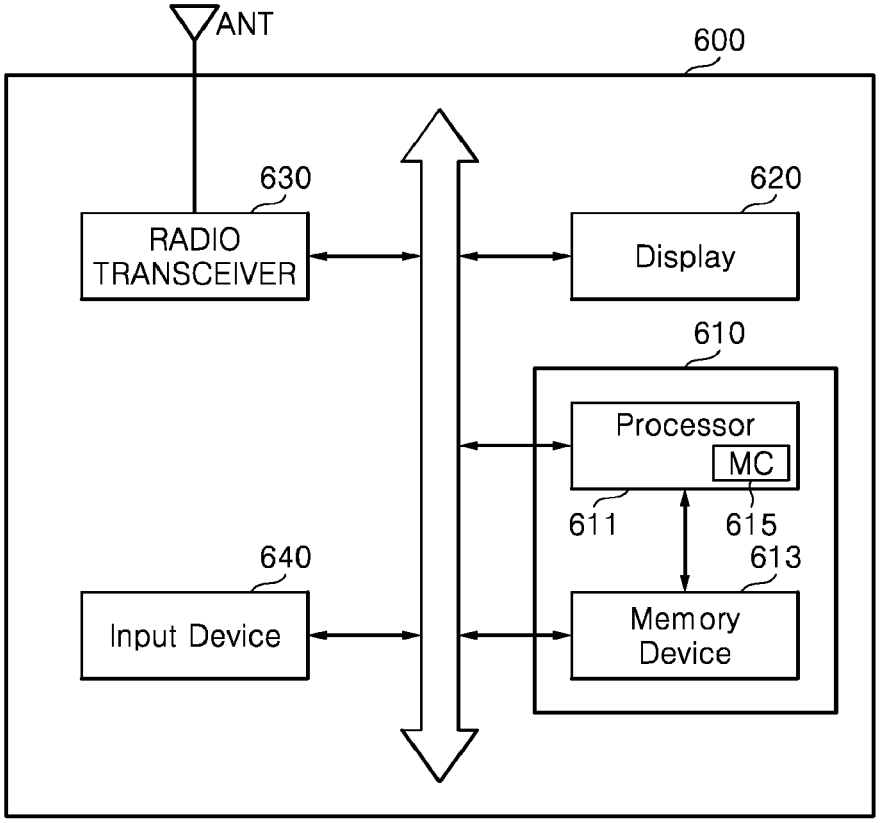
FIG. 25 is a block diagram according to another example embodiment of the memory system including the memory device illustrated in FIG. 1.

FIG. 25 is a block diagram according to another example embodiment of the memory system including the memory device illustrated in FIG. 1. Referring to FIGS. 1 and 25, a system 600 may be embodied in an electronic device or a portable device. The portable device may be embodied in a cellular phone, a smart phone, or a tablet PC.

The system 600 includes a processor 611 and a memory device 613. The memory device 613 may be the memory device of FIG. 1. According to an example embodiment, the processor 611 and the memory device 613 may be packaged in a package 610. In this case, the package 610 may be mounted on a system board (not shown). The package 610 may denote the package 300 illustrated in FIG. 20, or the package 300' illustrated in FIG. 21.

The processor 611 includes a memory controller 615 which may control a data processing operation of the memory device 613 (e.g., a write operation or a read operation). The memory controller 615 may be controlled by the processor 611 entirely controlling an operation of the system 600. According to an example embodiment, the memory controller 615 may be connected between the processor 611 and the memory device 613.

Data stored in the memory device 613 may be displayed through a display 620 according to a control signal and/or command of the processor 611.

A radio transceiver 630 may transmit or receive a radio signal through an antenna ANT. For example, the radio transceiver 630 may convert a radio signal received through the antenna ANT into a signal which the processor 611 may process. Accordingly, the processor 611 may process a signal output from the radio transceiver 630, store the processed signal in the memory device 613 or display the processed signal through the display 620.

The radio transceiver 630 may convert a signal output from the processor 611 into a radio signal, and output the converted radio signal to outside through the antenna ANT.

An input device 640, as a device which may input a control signal for controlling an operation of the processor 611 or data to be processed by the processor 611, may be embodied in a pointing device such as a touch pad and a computer mouse, a keypad, or a keyboard.

The processor 611 may control the display 620 so that data output from the memory device 613, a radio signal output from the radio transceiver 630, or data output from the input device 640 may be displayed through the display 620.

Figure 26:
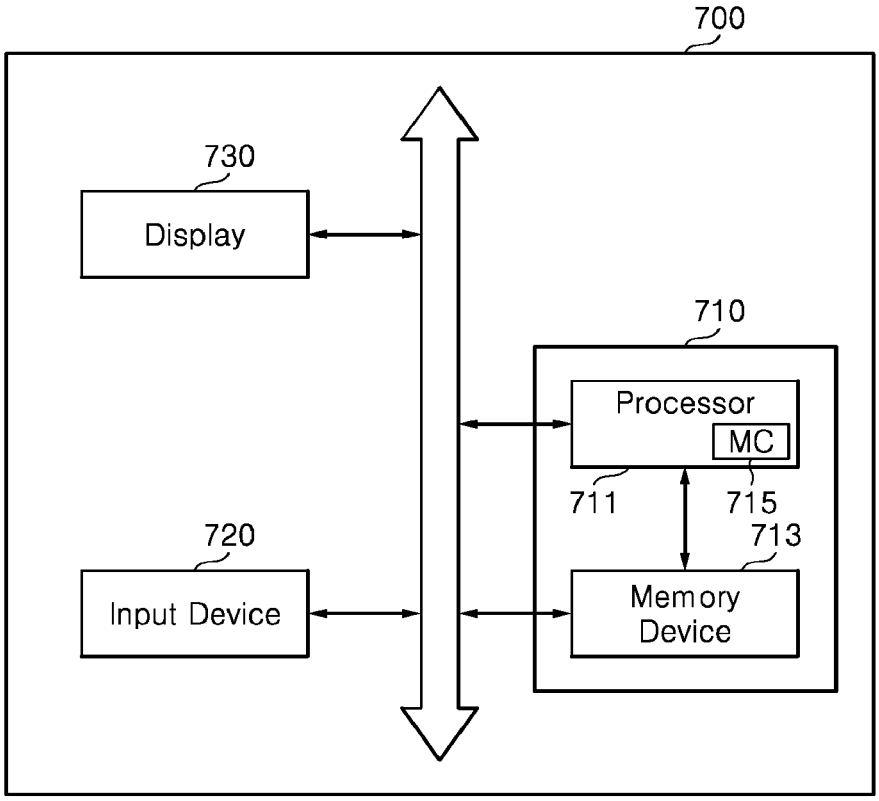
FIG. 26 is a block diagram according to still another example embodiment of the memory system including the memory device illustrated in FIG. 1.

FIG. 26 is a block diagram according to still another example embodiment of the memory system including the memory device illustrated in FIG. 1. Referring to FIGS. 1 and 26, a system 700 may be embodied in a personal computer (PC), a tablet PC, a net-book, an e-reader, a personal digital assistant (PDA), a portable multimedia player (PMP), a MP3 player, or a MP4 player.

The system 700 includes a processor 711 for entirely controlling an operation of the system 700 and a memory device 713. The memory device 713 may denote the memory device 100 illustrated in FIG. 1. According to an example embodiment, the processor 711 and the memory device 713 may be packaged in a package 710. The package 710 may be mounted on a system board (not shown). The package 710 may denote the package 300 illustrated in FIG. 20 or the package 300' illustrated in FIG. 21.

The processor 711 may include a memory controller 715 controlling an operation of the memory device 713. The processor 711 may display data stored in the memory device 713 through the display 730 according to an input signal generated by the input device 720. For example, the input device 720 may be embodied in a pointing device such as a touch pad or a computer mouse, a keypad, or a keyboard.

Figure 27:
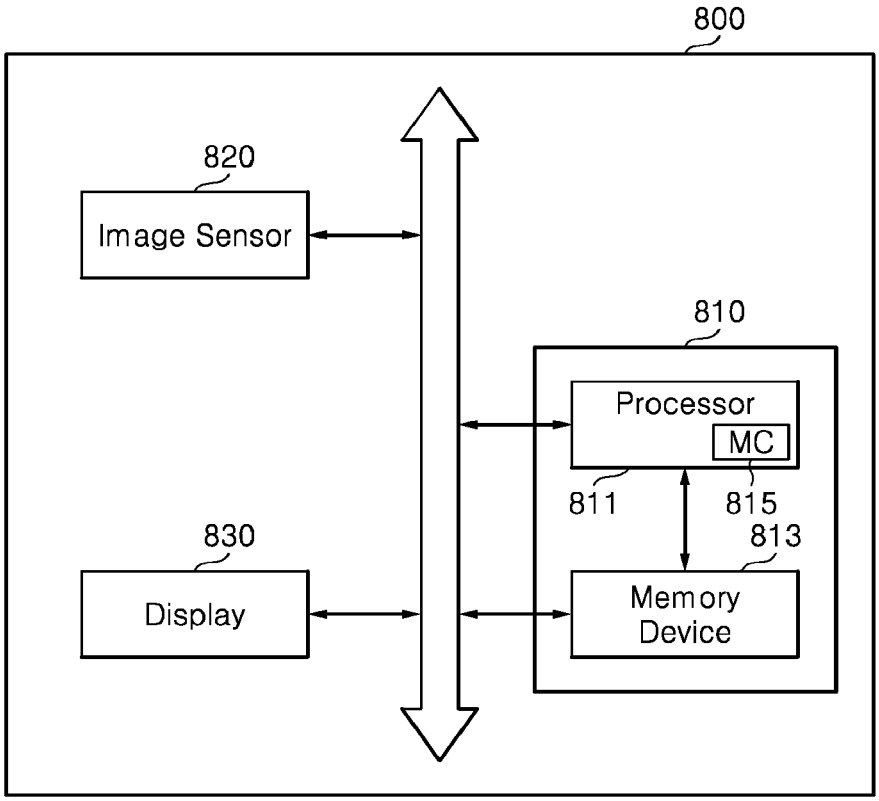
FIG. 27 is a block diagram according to still another example embodiment of the memory system including the memory device illustrated in FIG. 1.

FIG. 27 is a block diagram according to still another example embodiment of the memory system including the memory device illustrated in FIG. 1. Referring to FIGS. 1 and 27, a system 800 may be embodied in a digital camera or a portable device attached to the digital camera.

The system 800 includes a processor 811 entirely controlling an operation of the system 800 and a memory device 813. Here, the memory device 813 may denote the memory device 100 of FIG. 1. The processor 811 may include a memory controller 815 controlling an operation of the memory device 813.

According to an example embodiment, the processor 811 and the memory device 813 may be packaged in a package 810. The package 810 may be mounted on a system board (not shown). The package 810 may denote the package 300 illustrated in FIG. 20 or the package 300' illustrated in FIG. 21.

An image sensor 820 of the system 800 converts an optical image into a digital signal, and the converted digital signal is stored in the memory device 813 under a control of the processor 811 or displayed through the display 830. In addition, the digital signal stored in the memory device 813 is displayed through the display 830 under a control of the processor 811.

FIG. 28 is a block diagram according to still another example embodiment of the memory system including the memory device illustrated in FIG. 1. A channel 901 may denote optical connection means. The optical connection means may denote an optical fiber, an optical waveguide, or a medium transmitting an optical signal.

Referring to FIGS. 1 and 28, a system 900 may include a first system 1000 and a second system 1100. The first system 1000 may include a first memory device [100a] *100* and an electric-photo conversion circuit 1010. The electric-photo conversion circuit 1010 may convert an electrical signal output from the first memory device [100a] *100* into a photo signal, and output the converted photo signal to the second system 1100 through optical connection means 901.

The second system 1100 includes a photoelectric conversion circuit 1120 and a second memory device [100b] *100-2*. The photoelectric conversion circuit 1120 may convert a photo signal input through the optical connection means 901 into an electric signal, and transmit the converted electrical signal to the second memory device [100b] *100-2*.

The first system 1000 may further include the photoelectric conversion circuit 1020, and the second system 1100 may further include the electric-photo conversion circuit 1110.

When the second system 1100 transmits data to the first system 1000, the electric-photo conversion circuit 1110 may convert an electrical signal output from the second memory device [100b] *100-2* into a photo signal, and output the converted photo signal to the first system through the optical connection means 901. The photoelectric conversion circuit 1020 may convert a photo signal input through the optical connection means 901 into an electric signal, and transmit the converted electrical signal to the first memory device [100a] *100*. A structure and an operation of each memory device [100a] *100* and [100b] *100-2* are substantially the same as a structure and an operation of the memory device 100 of FIG. 1.

A method according to an example embodiment of the inventive concepts, by selecting and using an output driver circuit or an input receiver circuit according to an operation mode, may embody an appropriate input/output interface in the operation mode.

The method according to an example embodiment of the inventive concepts, by selecting and using the appropriate output driver circuit or an input receiver circuit in an operation mode, may improve efficiency in electricity and maintain good property of a transmission signal.

Although a some example embodiments of the inventive concepts have been shown and described, it will be appreciated by those skilled in the art that changes may be made in these embodiments without departing from the principles and spirit of the inventive concepts, the scope of which is defined in the appended claims and their equivalents.

What is claimed is:

1. An input/output interface for a memory device comprising:

a mode selection circuit configured to generate a mode selection signal; and an output driver block configured to be connected to an input/output pad and to transmit an output data signal, the input/output pad being terminated *at the pad* with one of a VSSQ termination, a VDDQ termination and a termination off mode based on the mode selection signal, and the output driver block comprising a plurality of output driver circuits, and one of the plurality of output driver circuits being configured to selectively operate *or not operate* during transmitting the output data signal based on the mode selection signal, wherein each of the plurality of output driver circuits has different topology suitable for different operation speed, the operation speed selected from a group including a low speed operation, and a high speed operation faster than the low speed operation.

2. The input/output interface of claim 1, wherein the VSSQ termination has a termination *voltage* level of a ground voltage level and the VDDQ termination has a termination *voltage* level of a supply voltage level respectively.

3. The input/output interface of claim 1, wherein the mode selection signal is configured to [receive] *include* operating frequency information for selecting one among a plurality of on-die termination (ODT) circuits.

4. The input/output interface of claim 3, wherein the mode selection signal is configured to select the termination off mode if the operating frequency information indicates the low speed operation.

5. The input/output interface of claim 3, wherein the mode selection signal [is configured] *includes information indicating* to select the VDDQ termination if the operating frequency information indicates an intermediate speed operation which is faster than the low speed operation but slower than the high speed operation.

6. The input/output interface of claim 3, wherein the mode selection signal [is configured] *includes information indicating* to select the VSSQ termination if the operating frequency information indicates the high speed operation.

7. The input/output interface of claim 3, wherein the mode selection signal [is configured] *includes information indicating* to select a first output driver circuit among the plurality of the output driver circuits if the operating frequency information indicates the high speed operation, wherein *a* pull-up driver of the first output driver circuit comprises a NMOS transistor.

8. The input/output interface of claim 3, wherein the mode selection signal [is configured] *includes information indicating* to select a second output driver circuit among the plurality of the output driver circuits if the operating frequency information indicates one of an intermediate speed operation and the low speed operation, the intermediate speed operation being faster than the low speed operation and slower than the high speed operation, wherein *a* pull-up driver of the second output driver circuit comprises a PMOS transistor.

9. An input/output interface for a memory device comprising:

a mode selection circuit configured to generate a mode selection signal;

a termination circuit configured to provide the input/output interface with one of a VSSQ termination, a VDDQ termination and a termination off mode in response to the mode selection signal; and an output driver block configured to transmit a data output signal, the output driver block being connected to an input/output pad and comprising a plurality of output driver circuits, wherein one of the plurality of output driver circuits is configured to selectively operate *or not operate* according to the mode selection signal, the mode selection signal indicating a termination type of the termination circuit, wherein each of the plurality of output driver circuits has different topology suitable for different operation speed, the operation speed selected from a group including a low speed operation, and a high speed operation faster than the low speed operation.

10. The input/output interface of claim 9, wherein the VSSQ termination has a termination *voltage* level of a ground voltage level and the VDDQ termination has a termination *voltage* level of a supply voltage level respectively.

11. The input/output interface of claim 9, wherein the mode selection signal [is configured] *includes information indicating* to receive operating frequency information for selecting one among a plurality of on-die termination (ODT) circuits.

12. The input/output interface of claim 11, wherein the mode selection signal [is configured] *includes information indicating* to select the termination off mode if the operating frequency information indicates the low speed operation.

13. The input/output interface of claim 11, wherein the mode selection signal [is configured] *includes information indicating* to select the VDDQ termination if the operating frequency information indicates an intermediate speed operation, the intermediate speed operation faster than the low speed operation and slower than the high speed operation.

14. The input/output interface of claim 11, wherein the mode selection signal [is configured] *includes information indicating* to select the VSSQ termination if the operating frequency information indicates the high speed operation.

15. The input/output interface of claim 11, wherein the mode selection signal [is configured] *includes information indicating* to select a first output driver circuit among the plurality of the output driver circuits if the operating frequency information indicates the high speed operation, wherein *a* pull-up driver of the first output driver circuit comprises a NMOS transistor.

16. The input/output interface of claim 11, wherein the mode selection signal [is configured] *includes information indicating* to select a second output driver circuit among the plurality of the output driver circuits if the operating frequency information indicates one of an intermediate speed operation faster than the low speed operation and slower than the high speed operation, and the low speed operation, wherein *a* pull-up driver of the second output driver circuit comprises a PMOS transistor.

17. An input/output interface circuit for a memory device comprising:

a mode selection circuit configured to generate a mode selection signal;

a termination circuit configured to provide the input/output interface with one of a VSSQ termination, a VDDQ termination and a termination off mode in response to the mode selection signal; and an output driver block connected to an input/output pad including, a first output driver circuit configured to transmit a output data signal, the first output driver circuit including a NMOS pull-up driver[;], and a second output driver circuit configured to transmit the output data signal, the second output driver circuit including a PMOS pull-up driver, wherein one of the first output driver circuit and the second output driver circuit is selected to transmit the output data signal in response to the mode selection signal.

18. The input/output interface of claim 17, wherein the VSSQ termination has a termination *voltage* level of a ground voltage level and the VDDQ termination has a termination *voltage* level of a supply voltage level respectively.

19. The input/output interface of claim 17, wherein the mode selection circuit is configured to receive operating frequency information for selecting one among a plurality of on-die termination (ODT) circuits.

20. The input/output interface of claim 19, wherein the mode selection signal [is configured] *includes information*

*indicating* to select the first output driver circuit if the operating frequency information indicates a high speed operation.

21. The input/output interface of claim 19, wherein the mode selection signal [is configured] *includes information indicating* to select the second output driver circuit if the operating frequency information indicates one of a medium speed operation and a low speed operation.

* * * * *